United States Patent
Choi

(10) Patent No.: US 12,446,224 B2
(45) Date of Patent: Oct. 14, 2025

(54) SEMICONDUCTOR MEMORY DEVICE AND MANUFACTURING METHOD OF THE SEMICONDUCTOR MEMORY DEVICE

(71) Applicant: SK hynix Inc., Icheon-si (KR)

(72) Inventor: Kang Sik Choi, Seongnam-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 18/507,505

(22) Filed: Nov. 13, 2023

(65) Prior Publication Data

US 2024/0081066 A1 Mar. 7, 2024

Related U.S. Application Data

(63) Continuation of application No. 17/572,154, filed on Jan. 10, 2022, now Pat. No. 11,856,777, which is a
(Continued)

(30) Foreign Application Priority Data

Nov. 1, 2019 (KR) .......................... 10-2019-0138568

(51) Int. Cl.
*H10B 43/27* (2023.01)
*H01L 21/768* (2006.01)
(Continued)

(52) U.S. Cl.
CPC ....... *H10B 43/27* (2023.02); *H01L 21/76805* (2013.01); *H01L 21/76816* (2013.01);
(Continued)

(58) Field of Classification Search
CPC ......... H01L 21/76805; H01L 21/76816; H01L 21/76877; H01L 21/76895; H01L 23/5226;
(Continued)

(56) References Cited

U.S. PATENT DOCUMENTS 9,449,987 B1 9/2016 Miyata et al.
10,141,331 B1 * 11/2018 Susuki ................... H10B 43/50
(Continued)

FOREIGN PATENT DOCUMENTS

CN 104916646 A 9/2015
CN 107359165 A 11/2017
(Continued)

*Primary Examiner* — Galina G Yushina
(74) *Attorney, Agent, or Firm* — WILLIAM PARK AND ASSOCIATES LTD.

(57) ABSTRACT

A semiconductor memory device, and a method of manufacturing the semiconductor memory device, includes: a substrate including a peripheral circuit, a gate stack structure disposed over the substrate and including a cell array region and a stepped region that extends from the cell array region, a channel structure passing through the cell array region of the gate stack structure, a memory layer surrounding a sidewall of the channel structure, a first contact plug passing through the stepped region of the gate stack structure, and an insulating structure surrounding a sidewall of the first contact plug to insulate the first contact plug from the gate stack structure.

16 Claims, 42 Drawing Sheets

Related U.S. Application Data continuation of application No. 16/908,162, filed on Jun. 22, 2020, now Pat. No. 11,257,843.

(51) Int. Cl.

| | |
|---|---|
| *H01L 23/522* | (2006.01) |
| *H01L 23/528* | (2006.01) |
| *H01L 23/535* | (2006.01) |
| *H10B 41/27* | (2023.01) |
| *H10B 41/35* | (2023.01) |
| *H10B 41/41* | (2023.01) |
| *H10B 43/35* | (2023.01) |
| *H10B 43/40* | (2023.01) |

(52) U.S. Cl.
CPC ............... *H01L 21/76877* (2013.01); *H01L 21/76895* (2013.01); *H01L 23/5226* (2013.01); *H01L 23/5283* (2013.01); *H01L 23/535* (2013.01); *H10B 41/27* (2023.02); *H10B 41/35* (2023.02); *H10B 41/41* (2023.02); *H10B 43/35* (2023.02); *H10B 43/40* (2023.02)

(58) Field of Classification Search
CPC .............. H01L 23/535; H01L 21/76897; H01L 23/5386; H01L 29/66833; H01L 29/792; H01L 23/5283; H10B 43/27; H10B 41/27; H10B 41/35; H10B 41/41; H10B 43/35; H10B 43/40; H10B 43/30; H10B 43/20; H10B 43/50; H10B 43/10; H10D 30/0413; H10D 30/69
See application file for complete search history.

(56) References Cited

U.S. PATENT DOCUMENTS

| | | | |
|---|---|---|---|
| 10,388,666 B1* | 8/2019 | Kai | .............. H10D 88/00 |
| 2010/0202208 A1 | 8/2010 | Endo et al. | |
| 2016/0163732 A1 | 6/2016 | Lim et al. | |
| 2016/0322381 A1 | 11/2016 | Liu et al. | |
| 2017/0047343 A1* | 2/2017 | Lee | .............. H10B 43/40 |
| 2017/0148748 A1 | 5/2017 | Jeong et al. | |
| 2017/0338241 A1 | 11/2017 | Lee | |
| 2018/0277596 A1 | 9/2018 | Mori | |
| 2018/0301374 A1 | 10/2018 | Masamori et al. | |
| 2018/0308559 A1 | 10/2018 | Kim et al. | |
| 2019/0035804 A1 | 1/2019 | Kim et al. | |
| 2019/0043830 A1 | 2/2019 | Sakakibara et al. | |
| 2019/0333923 A1 | 10/2019 | Kim et al. | |
| 2019/0333932 A1 | 10/2019 | Kim | |
| 2019/0378857 A1* | 12/2019 | Lee | .............. H10D 64/258 |
| 2020/0027893 A1* | 1/2020 | Yang | .............. H10B 41/50 |
| 2020/0027896 A1 | 1/2020 | Eom | |
| 2020/0091170 A1 | 3/2020 | Baek | .............. H10B 43/27 |
| 2021/0082941 A1* | 3/2021 | Son | .............. H10B 43/10 |
| 2021/0125928 A1 | 4/2021 | Kim et al. | |

FOREIGN PATENT DOCUMENTS

| | | |
|---|---|---|
| CN | 107665893 A | 2/2018 |
| CN | 109309097 A | 2/2019 |
| CN | 109671712 A | 4/2019 |
| CN | 110349968 A | 10/2019 |
| KR | 1020170131945 A | 12/2017 |
| KR | 1020190056118 A | 5/2019 |
| KR | 1020190085475 A | 7/2019 |

* cited by examiner

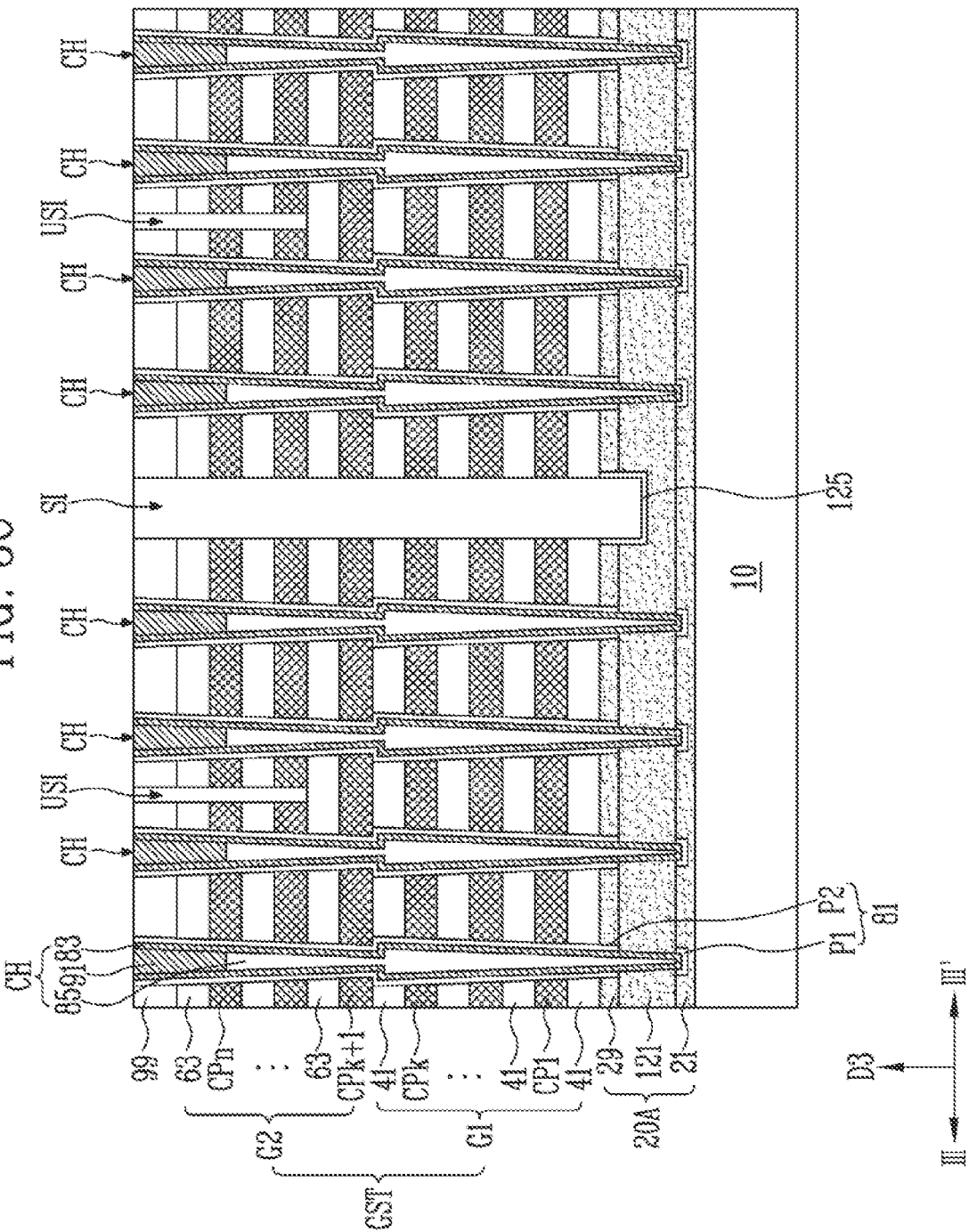

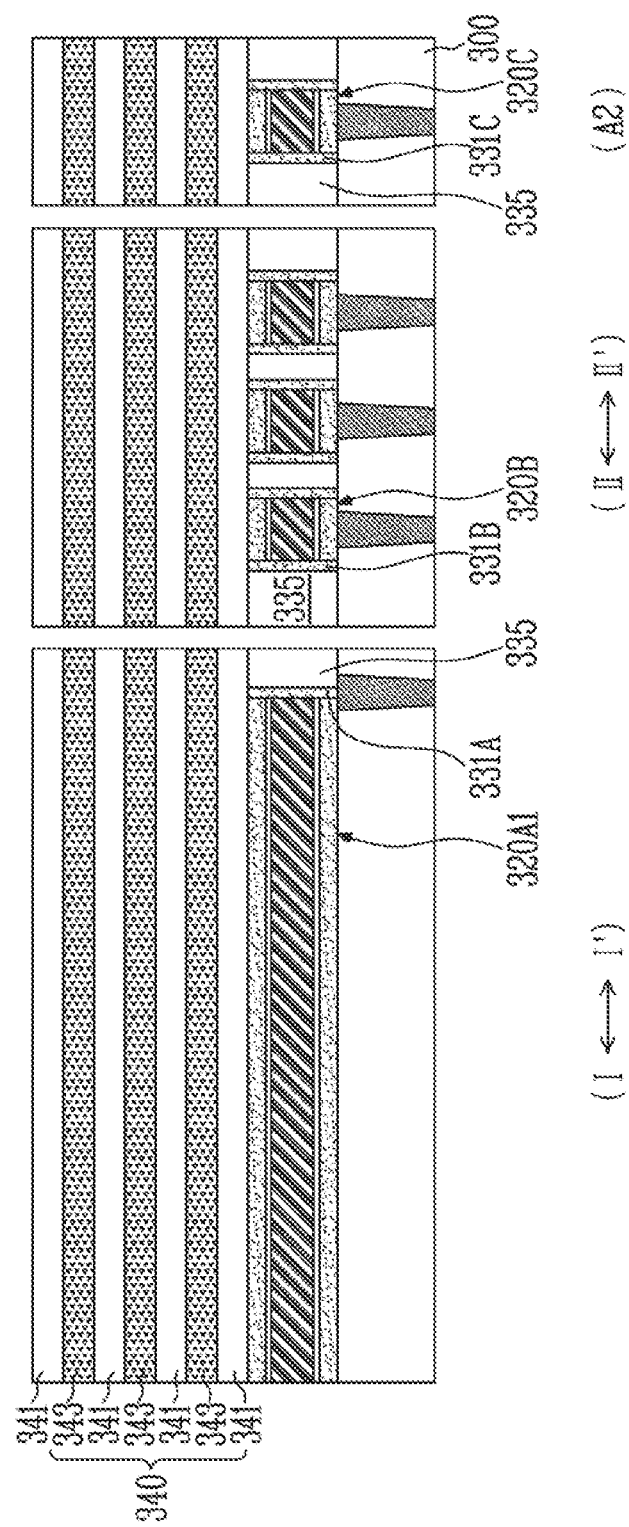

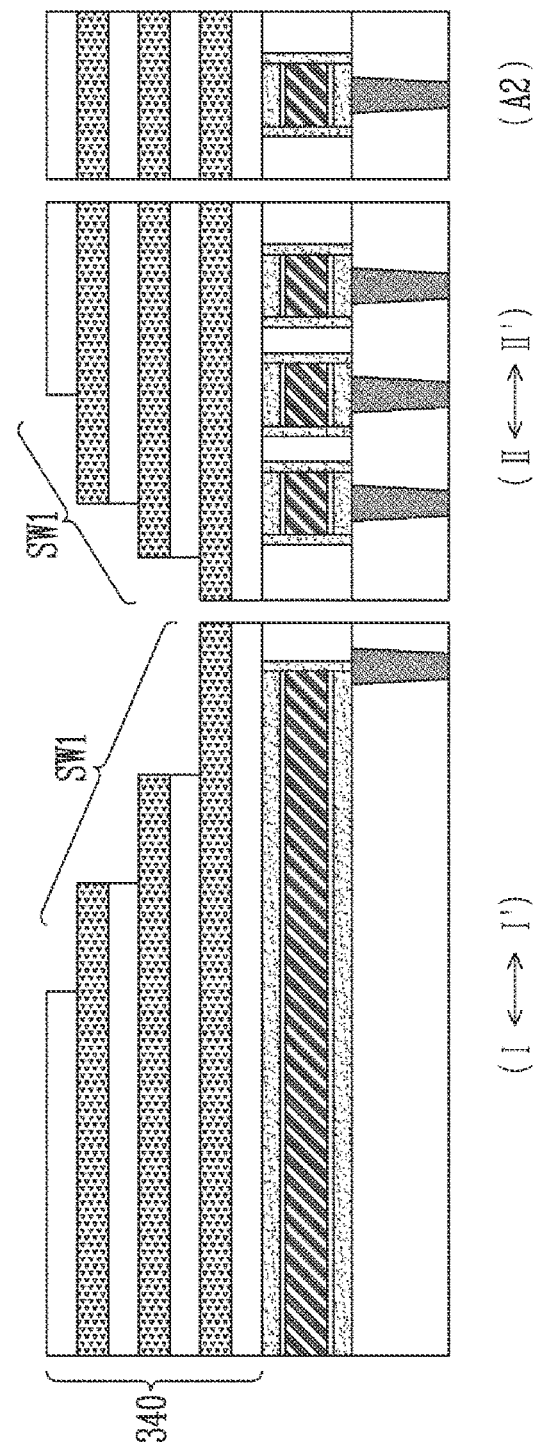

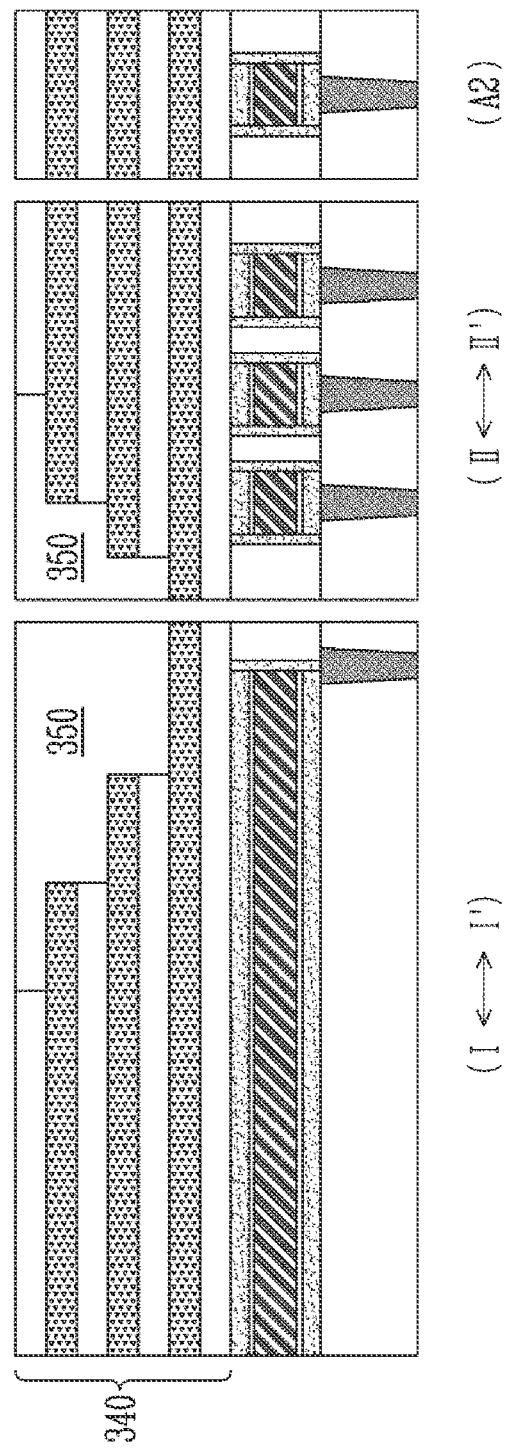

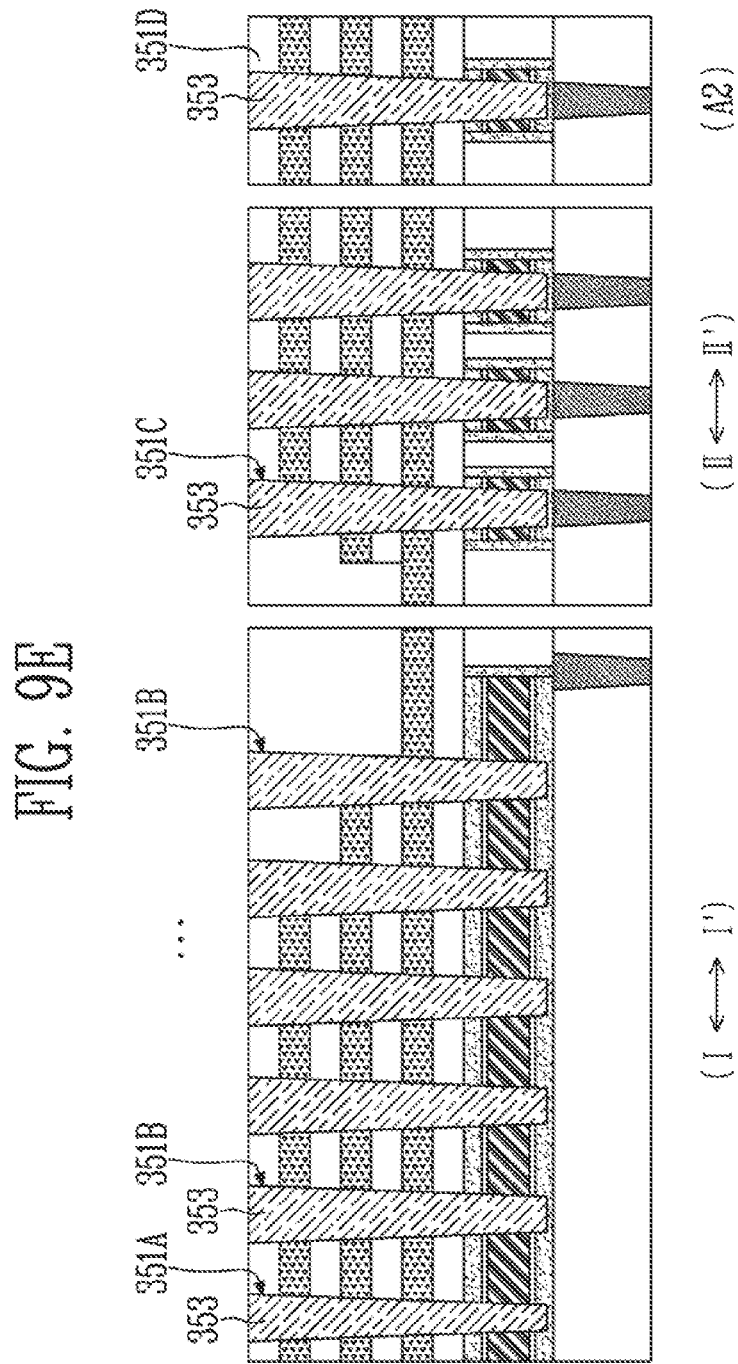

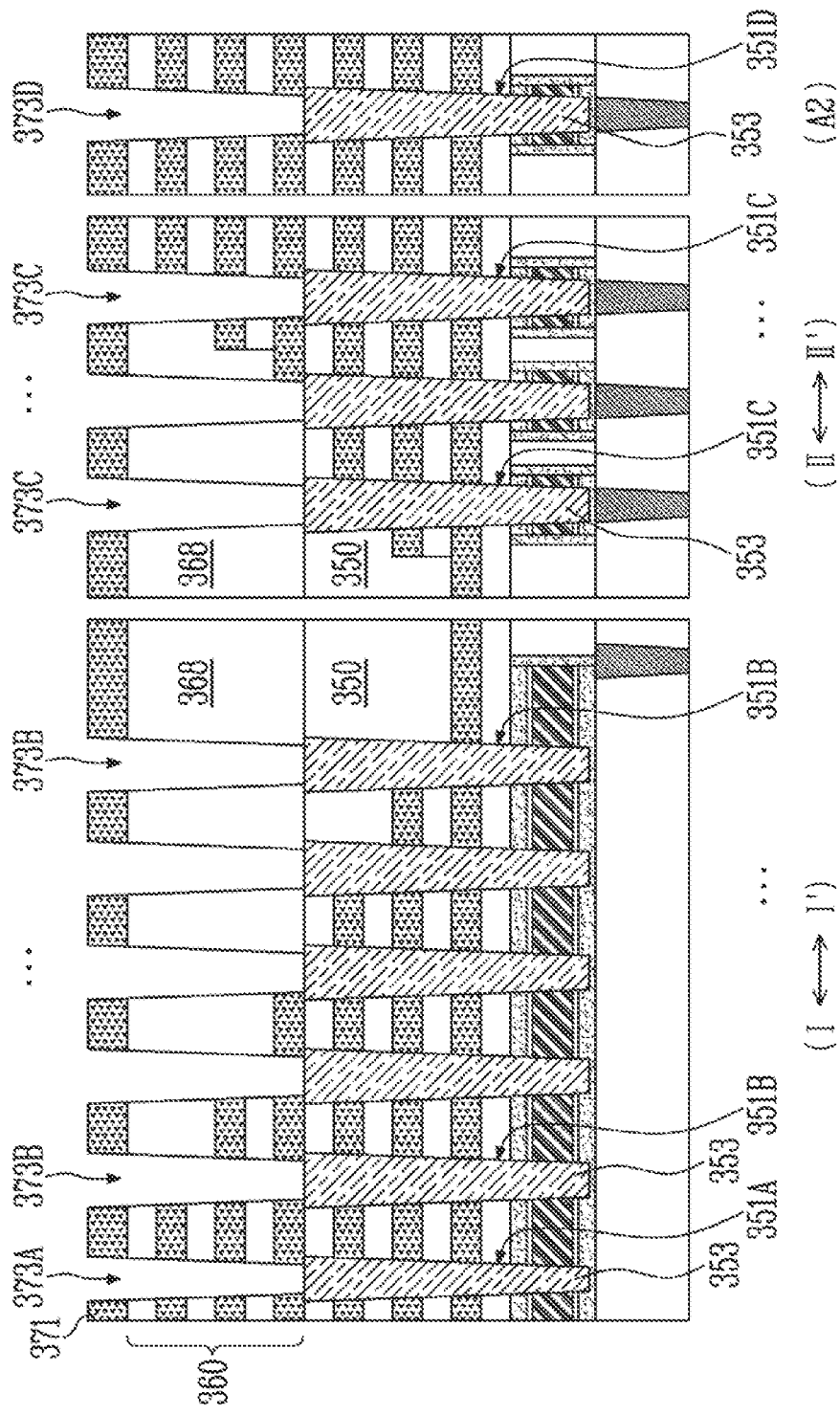

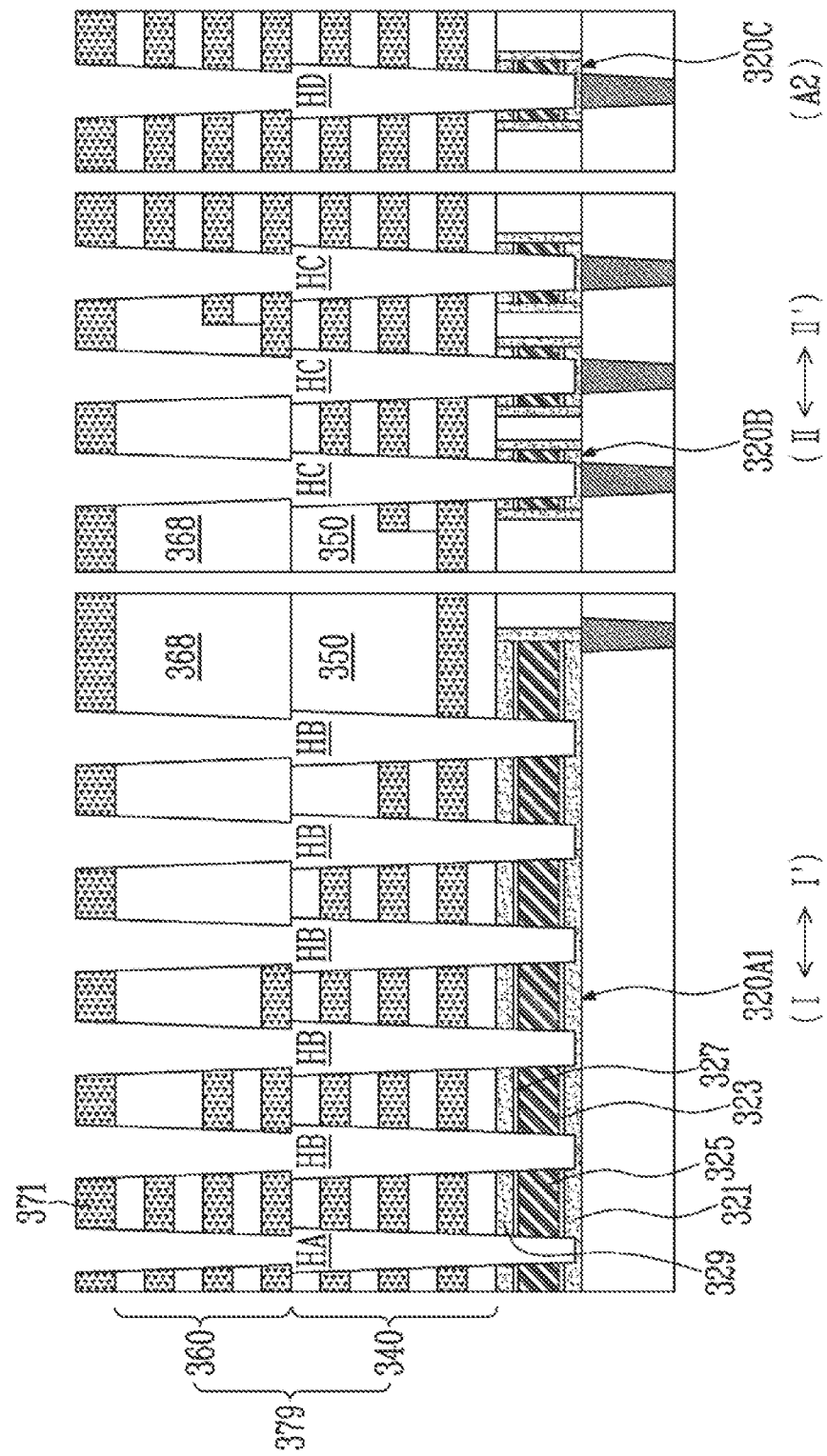

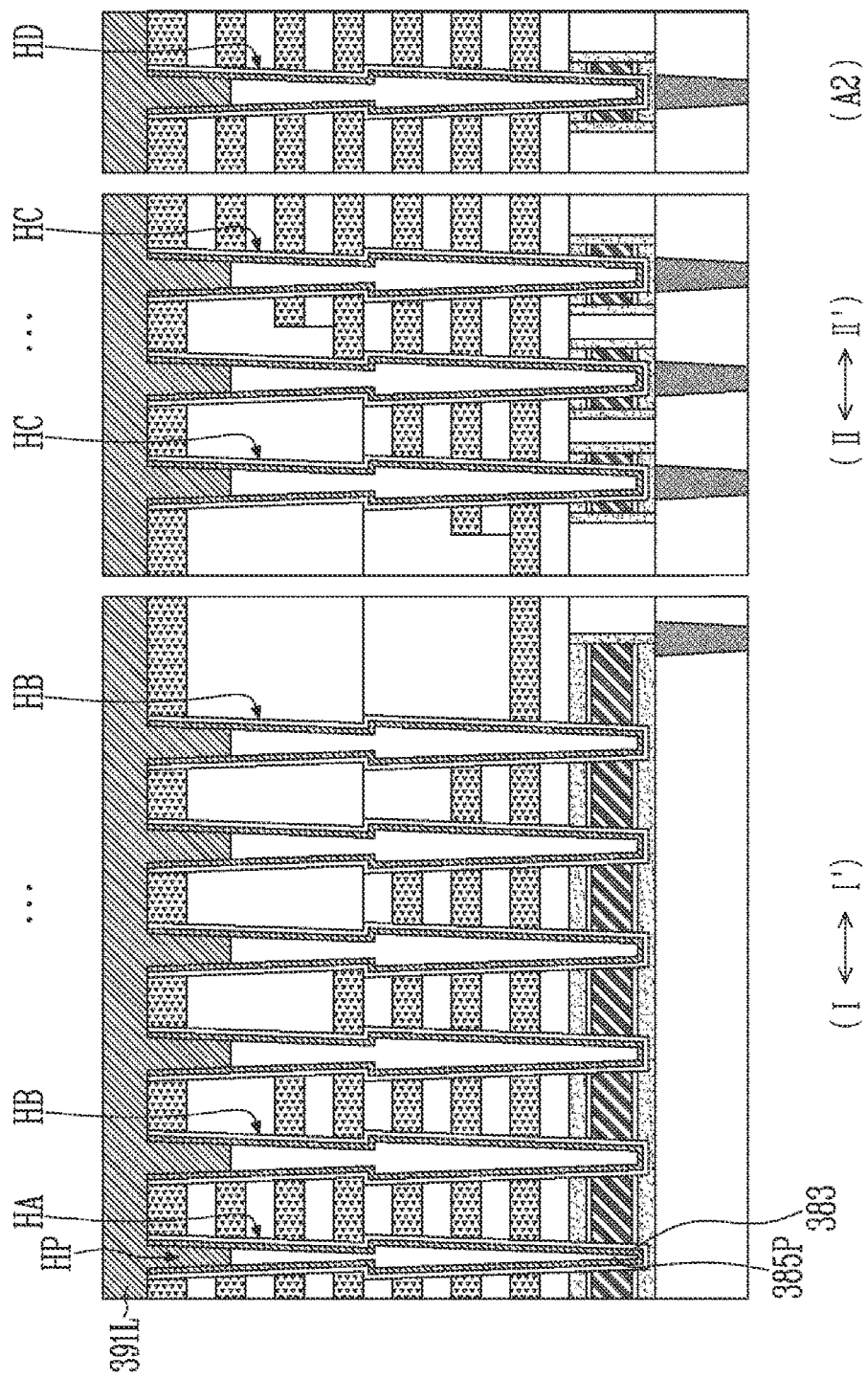

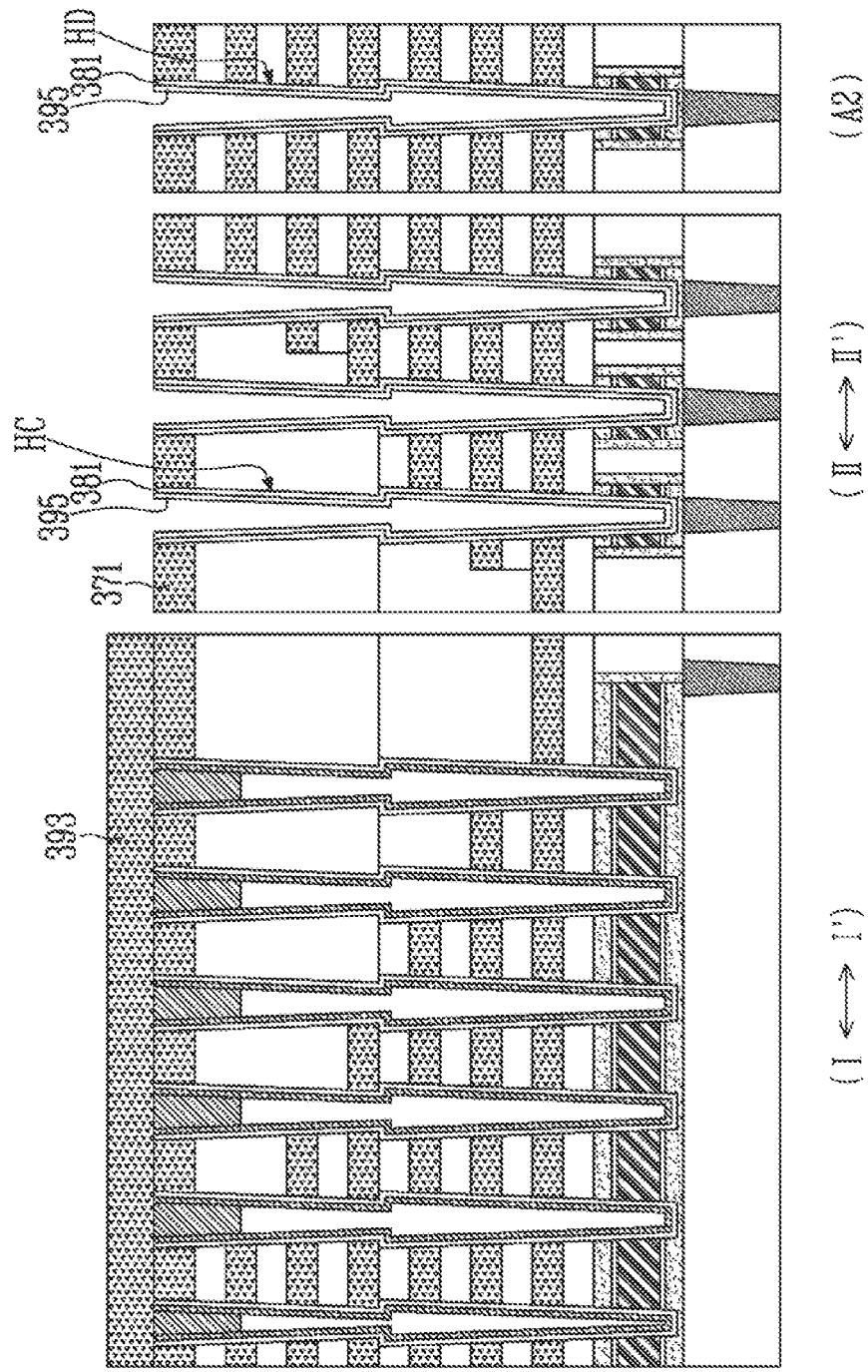

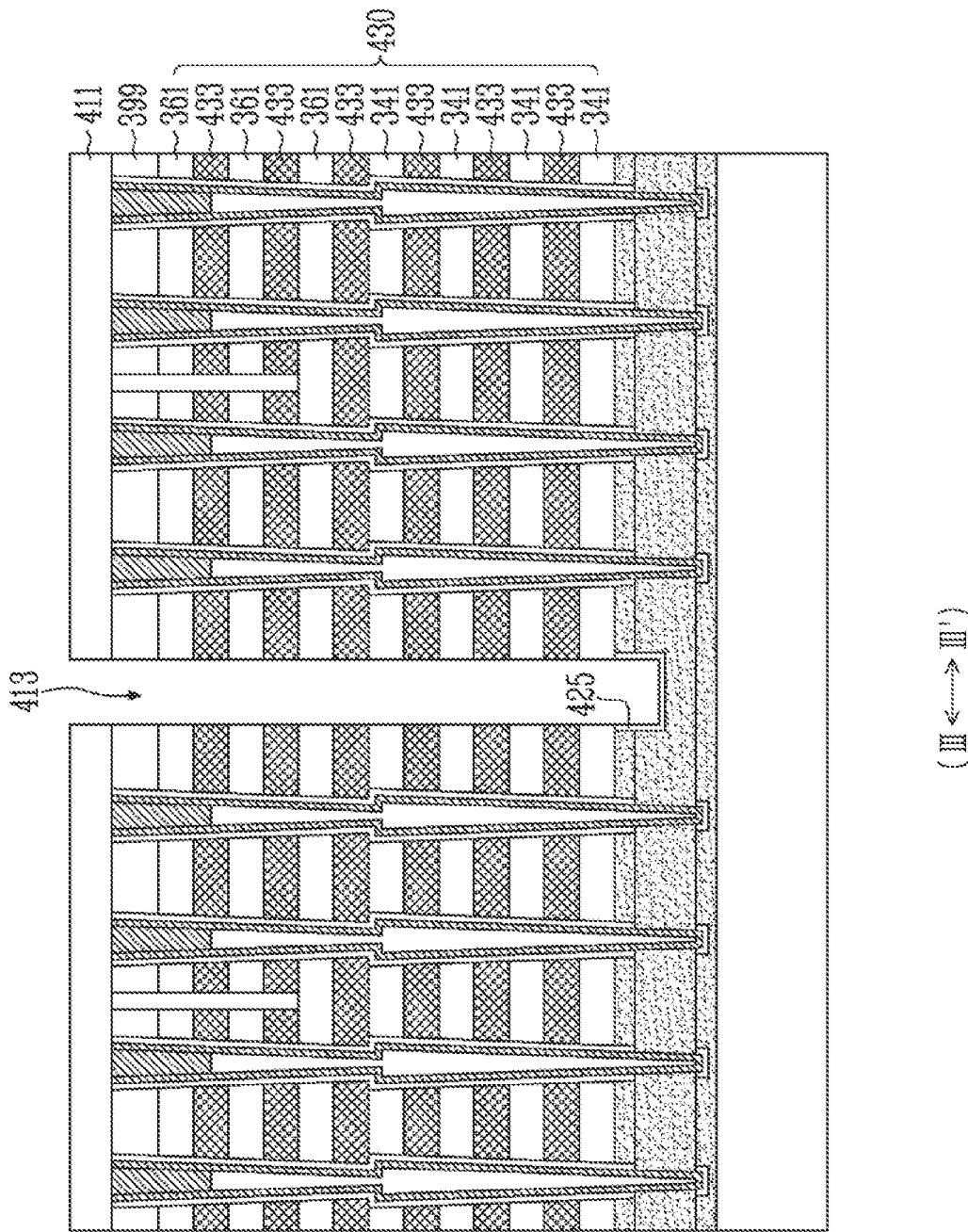

SEMICONDUCTOR MEMORY DEVICE AND MANUFACTURING METHOD OF THE SEMICONDUCTOR MEMORY DEVICE

CROSS-REFERENCE TO RELATED APPLICATION

The present application is a continuation application of U.S. patent application Ser. No. 17/572,154, filed on Jan. 10, 2022, which is a continuation application of U.S. patent application Ser. No. 16/908,162, filed on Jun. 22, 2020, and claims priority under 35 U.S.C. § 119(a) to Korean patent application number 10-2019-0138568, filed on Nov. 1, 2019, in the Korean Intellectual Property Office, the entire disclosure of which is incorporated herein by reference.

BACKGROUND

1. Technical Field

Various embodiments generally relate to a semiconductor memory device and a manufacturing method of the semiconductor memory device, and more particularly, to a three-dimensional semiconductor memory device and a manufacturing method of the three-dimensional semiconductor memory device.

2. Related Art

A semiconductor memory device may include a memory cell array and a peripheral circuit coupled to the memory cell array. The memory cell array may include a plurality of memory cells and the peripheral circuit may be configured to perform various operations of the memory cells.

The plurality of memory cells may be arranged in three dimensions to form a three-dimensional semiconductor memory device. In the three-dimensional semiconductor memory device, gate electrodes of the memory cells may be coupled to a plurality of word lines stacked over a substrate. To improve integration density of the three-dimensional semiconductor memory device, the number of word lines stacked on top of each other may be increased. The more word lines are stacked on top of each other, the more complicated manufacturing processes of a semiconductor memory device may become.

SUMMARY

According to an embodiment, a semiconductor memory device may include a substrate including a peripheral circuit, a gate stack structure disposed over the substrate and including a cell array region and a stepped region that extends from the cell array region, a channel structure passing through the cell array region of the gate stack structure, a memory layer surrounding a sidewall of the channel structure, a first contact plug passing through the stepped region of the gate stack structure, and an insulating structure surrounding a sidewall of the first contact plug to insulate the first contact plug from the gate stack structure.

According to an embodiment, a method of manufacturing a semiconductor memory device may include forming a preliminary structure including a first semiconductor pattern and a second semiconductor pattern separated from each other by an insulating layer, forming a stack structure including interlayer insulating layers and sacrificial layers alternately stacked on each other over the preliminary structure, forming a channel hole and a first contact hole passing through the stack structure, forming a memory layer on a surface of each of the channel hole and the first contact hole, filling the channel hole with a channel structure, forming a first contact plug in the first contact hole, and replacing the sacrificial layers by conductive patterns. The channel hole may overlap the first semiconductor pattern and the first contact hole may overlap the second semiconductor pattern. The first contact plug may pass through the memory layer in the first contact hole and the second semiconductor pattern. The conductive patterns may surround the channel structure and the first contact plug with the memory layer interposed between each of the conductive patterns and each of the channel structure and the first contact plug.

BRIEF DESCRIPTION OF THE DRAWINGS

FIGS. 3A to 3C are cross-sectional diagrams taken along lines I-I', II-II', and III-III' shown in FIG. 2;

FIGS. 9A to 9J are cross-sectional diagrams illustrating an embodiment regarding step ST3 shown in FIG. 7;

FIGS. 10A to 10K are cross-sectional diagrams illustrating an embodiment regarding step ST5 shown in FIG. 7;

FIGS. 12A, 12B, 13, 14A, and 14B are cross-sectional diagrams illustrating an embodiment regarding processes performed subsequent to step ST7 shown in FIG. 7;

DETAILED DESCRIPTION

The specific structural or functional descriptions disclosed herein are merely illustrative for the purpose of describing embodiments according to the concept of the present disclosure. Embodiments may be implemented in various forms, and should not be construed as being limited to the embodiments set forth herein.

Various embodiments are directed to a semiconductor memory device capable of simplifying manufacturing processes of the semiconductor memory device and a manufacturing method of the semiconductor memory device.

Figure 1:
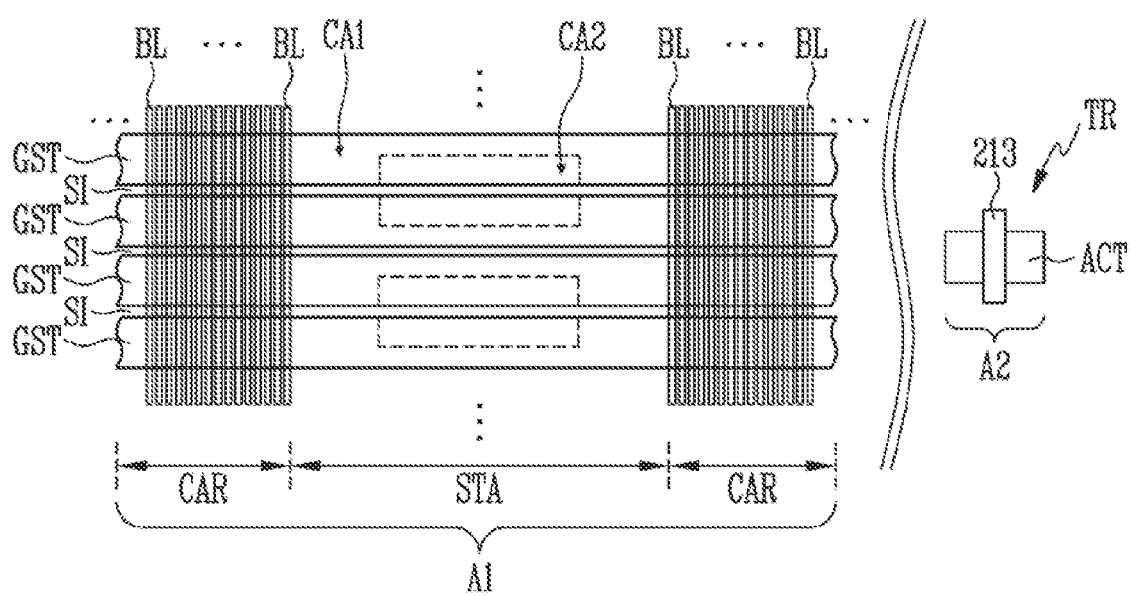
FIG. 1 is a schematic diagram illustrating a configuration of a semiconductor memory device according to an embodiment.

FIG. 1 is a schematic diagram illustrating a configuration of a semiconductor memory device according to an embodiment.

Figure 6:
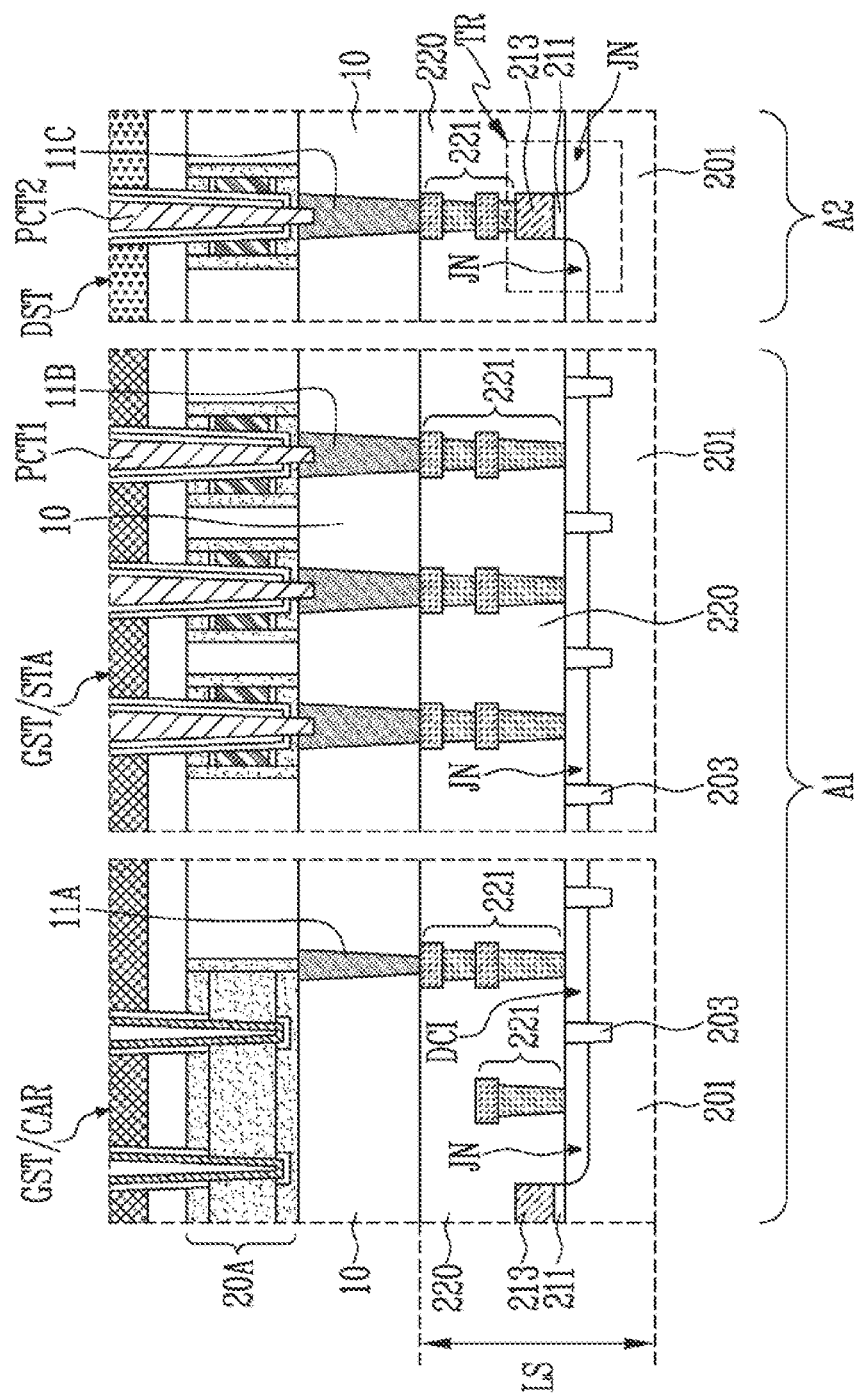
FIG. 6 is a cross-sectional diagram illustrating a lower structure of a semiconductor memory device according to an embodiment.

Referring to FIG. 1, the semiconductor memory device may include a peripheral circuit and a memory cell array disposed over a substrate 201 shown in FIG. 6 which includes a first region A1 and a second region A2. The first region A1 may be defined as a region that overlaps gate stack structures GST forming the memory cell array. The second region A2 may be defined as a region that does not overlap the gate stack structures GST.

Although not illustrated in FIG. 1, the peripheral circuit may include a row decoder, a page buffer, control logic, and the like. The row decoder, the page buffer, and the control logic may include transistors TR. A first group of transistors among the transistors TR included in the peripheral circuit may be disposed in the second region A2 of the substrate. A second group of transistors among the transistors TR included in the peripheral circuit may be disposed in the first region A1 of the substrate and may overlap the gate stack structures GST. A gate electrode 213 of each of the transistors TR may be disposed in an active region ACT defined in the substrate. Junctions JN shown in FIG. 6 which serve as a source and a drain of each of the transistors TR may be formed in the active regions ACT in opposite sides of the gate electrode 213.

The gate stack structures GST may be spaced apart from each other by a slit SI. Each of the gate stack structures GST may include a cell array region CAR and a stepped region STA. The stepped region STA may extend from the cell array region CAR. According to an embodiment, each of the gate stack structures GST may include two or more cell array regions CAR and the stepped structure STA disposed between adjacent cell array regions CAR. However, embodiments are not limited thereto. For example, the stepped structure STA of each of the gate stack structures GST may be disposed at an edge of the gate stack structure GST corresponding to the stepped structure STA.

The stepped structure STA may include a first contact region CA1 and a second contact region CA2. The stepped structure of the gate stack structure GST may be coupled to gate contact plugs GCT shown in FIG. 2 which are disposed in the first contact region CA1 corresponding to the stepped structure. The stepped structure of the gate stack structure GST may be penetrated by first contact plugs PCT1 shown in FIG. 2 which are disposed in the second contact region CA2 corresponding to the stepped structure.

Figure 5A:
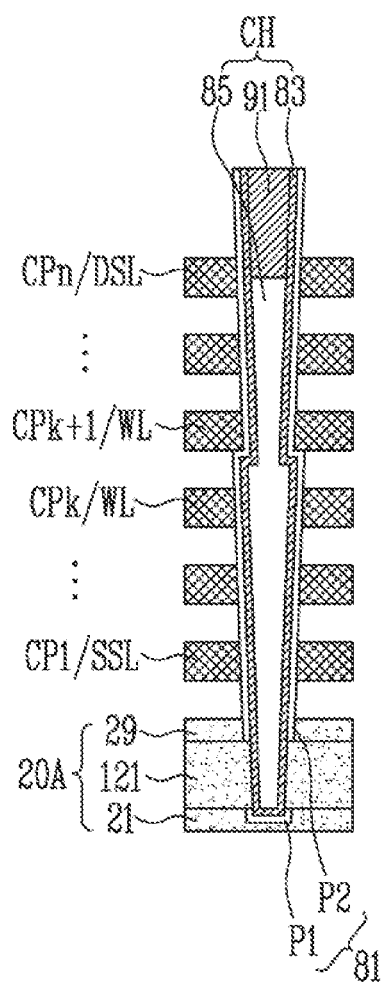
FIG. 5A is a diagram illustrating a memory string according to an embodiment.

The cell array region CAR may include a plurality of word lines WL shown in FIG. 5A and select lines SSL and DSL shown in FIG. 5A which are coupled to memory strings. The memory strings may be coupled to bit lines BL disposed over the gate stack structures GST.

According to an embodiment, the transistors TR disposed in the second region A2 may overlap a dummy stack structure disposed in the same level as the gate stack structures GST. According to an embodiment, a dummy stack structure may be omitted.

Figure 2:
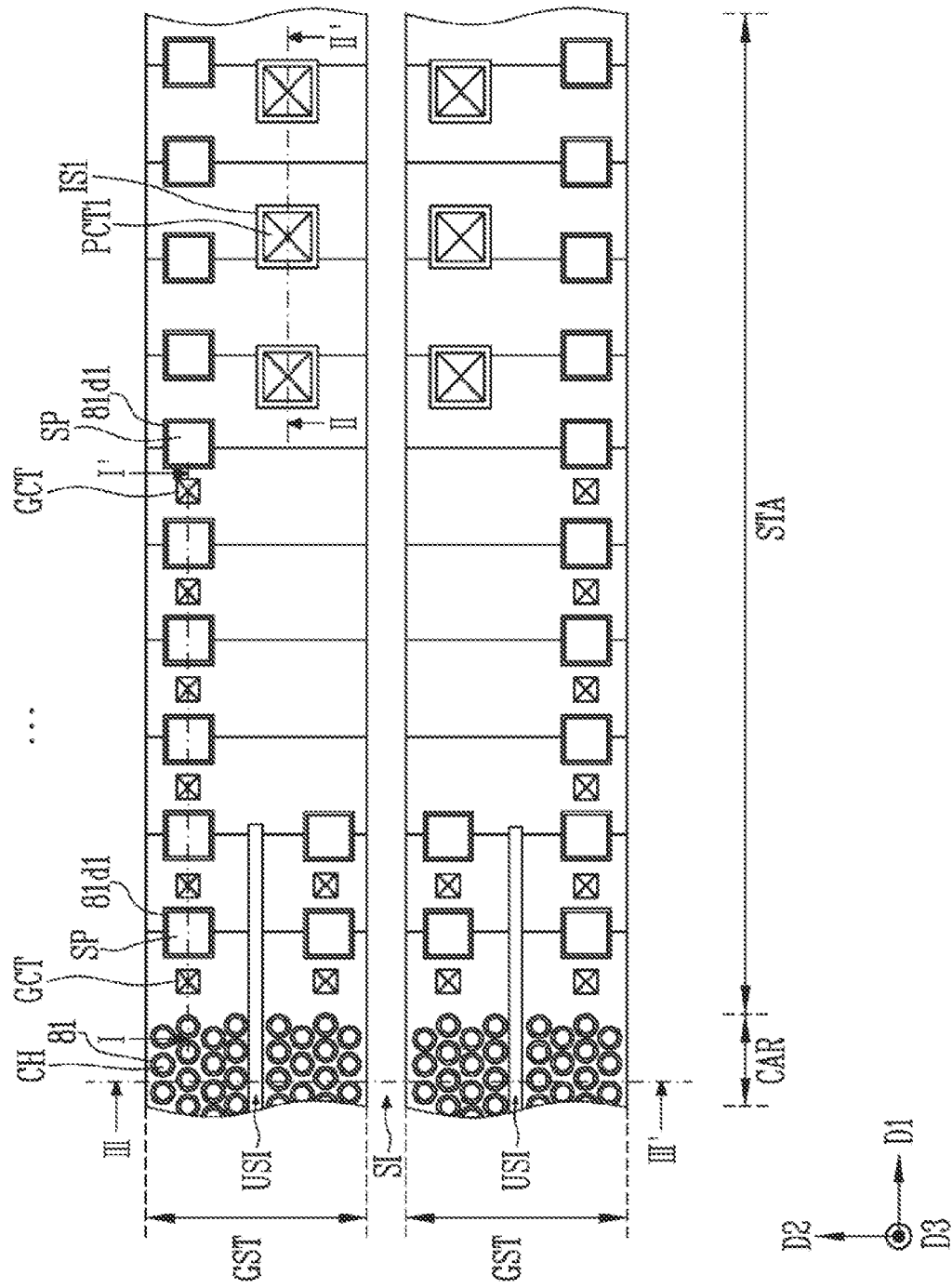
FIG. 2 is a diagram illustrating a cell array region and a stepped region of a semiconductor memory device according to an embodiment.

FIG. 2 is a diagram illustrating the cell array region CAR and the stepped region STA of a semiconductor memory device according to an embodiment.

Referring to FIG. 2, the cell array region CAR of the gate stack structure GST may be penetrated by channel structures CH. The cell array region CAR of the gate stack structure GST may extend in a first direction D1 and a second direction D2. The channel structures CH may extend in a third direction D3 orthogonal to a plain extending in the first direction D1 and the second direction D2. According to an embodiment, the first direction D1, the second direction D2, and the third direction D3 may correspond to an x-axis, a y-axis, and a z-axis of a Cartesian coordinate system.

A sidewall of each of the channel structures CH may be surrounded by a memory layer 81. The channel structures CH may be disposed in the gate stack structure GST corresponding to the channel structures. The channel structures CH may be arranged in zigzag. The array of the channel structures CH is not limited thereto. In an embodiment, the array of the channel structures CH may form a matrix structure. Each of the channel structures CH may have one of various cross-sectional shapes, including, but not limited to, a circle, an ellipse, a polygon, or a square.

The channel structures CH may be arranged in opposite sides of an upper slit USI that is formed in the gate stack structure GST. The upper slit USI and the slit SI may extend in the first direction D1 and the third direction D3.

The stepped structure STA of the gate stack structure GST may include the first contact region CA1 coupled to the gate contact plugs GCT and the second contact region CA2 penetrated by the first contact plugs PCT1 as described with reference to FIG. 1. The semiconductor memory device may further include supporting pillars SP passing through the stepped region STA of the gate stack structure GST.

Each of the gate contact plugs GCT, the supporting pillars SP, and the first contact plugs PCT1 may have one of various cross-sectional shapes, including, but not limited to, an ellipse, a polygon, or a square. Arrangement of the gate contact plugs GCT, the supporting pillars SP, and the first contact plugs PCT1 is not limited to the embodiment illustrated in FIG. 2 but may be variously changed. In a plane extending in the first direction D1 and the second direction D2, the area of each of the supporting pillars SP and the first contact plugs PCT1 may be greater than the area of each of the channel structures CH.

The gate contact plugs GCT may overlap the stepped region STA and may extend in the third direction D3. A sidewall of each of the first contact plugs PCT1 may be surrounded by a first insulating structure IS1. Each of the first contact plugs PCT1 may be insulated from the gate stack structure GST by the first insulating structure IS1. A sidewall of each of the supporting pillars SP may be surrounded by a first dummy memory layer 81d1. The first dummy memory layer 81d1 may include the same material as the memory layer 81.

Figure 3A:
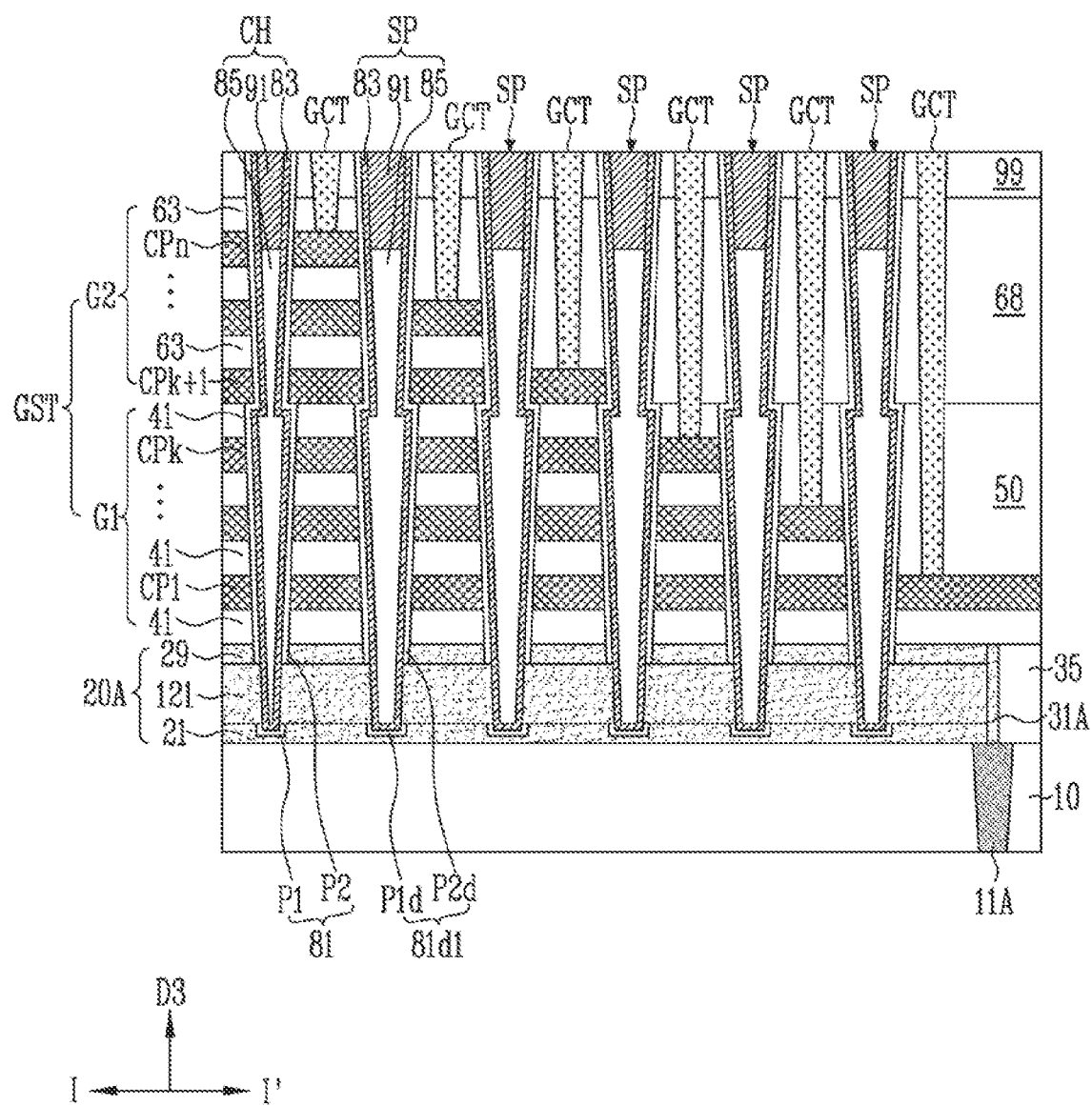
Figure 3B:
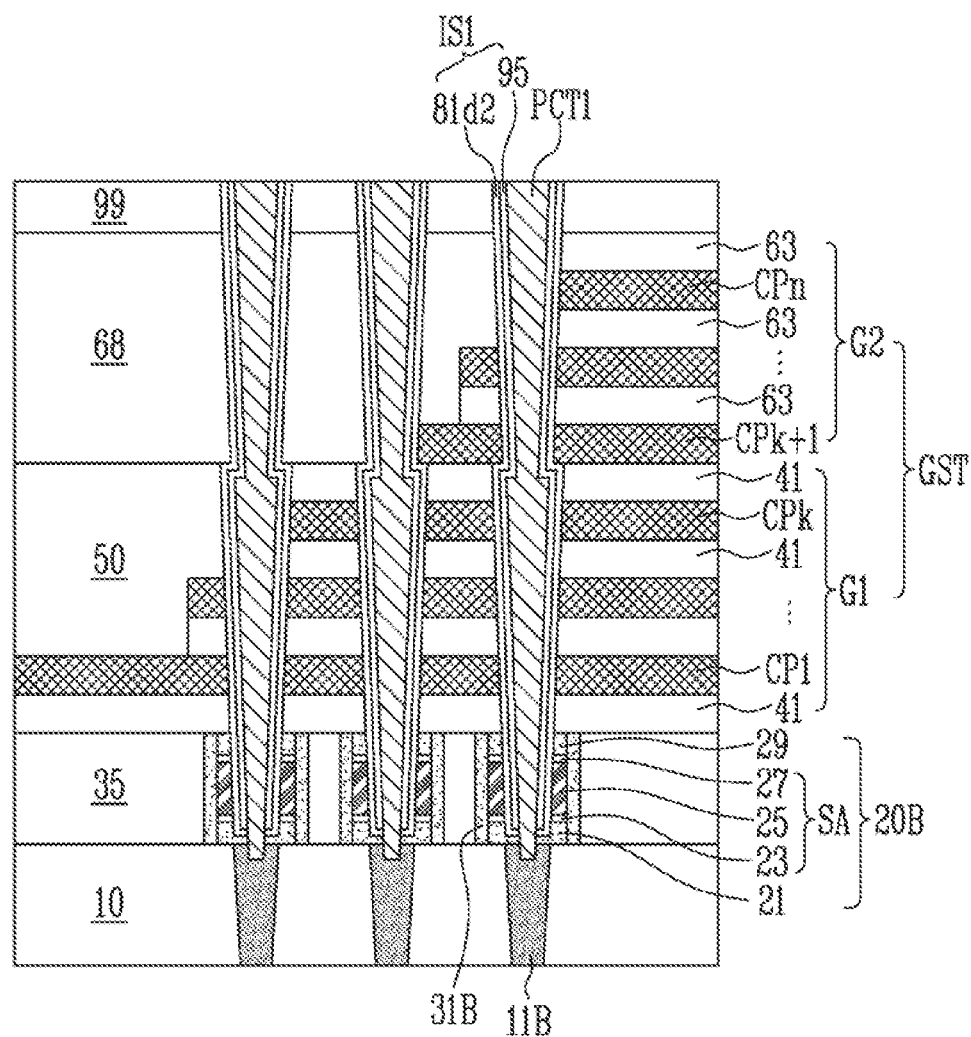

FIGS. 3A to 3C are cross-sectional diagrams taken along lines I-I', II-II', and III-III' shown in FIG. 2.

Referring to FIGS. 3A to 3C, the gate stack structure GST may include interlayer insulating layers 41 and 63 and conductive patterns CP1 to CPn alternately stacked on each other, where n is a natural number. The conductive patterns CP1 to CPn may be stacked to be spaced apart from each other in the third direction D3 by the interlayer insulating layers 41 or 63 disposed therebetween. The conductive patterns CP1 to CPn may include various conductive materials such as a doped semiconductor, a metal, and a conductive metal nitride. Each of the conductive patterns CP1 to CPn may include a single conductive material or two or more conductive materials. The interlayer insulating layers 41 and 63 may include a silicon oxide layer.

Each of the channel structures CH passing through the gate stack structure GST may be spaced apart from the conductive patterns CP1 to CPn by the memory layer 81. Each of the supporting pillars SP passing through the gate stack structure GST may be spaced apart from the conductive patterns CP1 to CPn by the first dummy memory layer 81d1.

Each of the supporting pillars SP may include the same material as each of the channel structures CH. According to an embodiment, each of the channel structures CH and supporting pillars SP may include a channel layer 83, a core insulating pattern 85, and a capping pattern 91. The channel layer 83 may be formed on the memory layer 81 or the first dummy memory layer 81$d$1 corresponding to the channel layer 83 and may include a semiconductor material. For example, the channel layer 83 may include silicon. The channel layer 83 of each of the channel structures CH may be used as a channel of a memory string. The core insulating pattern 85 and the capping pattern 91 may fill the central region of the channel layer 83. The core insulating pattern 85 may include an oxide. The capping pattern 91 may be disposed on the core insulating pattern 85 and may have a sidewall surrounded by an upper end of the channel layer 83. The capping pattern 91 may include a doped semiconductor layer including at least one of an n-type impurity and a p-type impurity. For example, the capping pattern 91 may include a doped silicon layer. According to an embodiment, the core insulating pattern 85 may be omitted and the channel layer 83 may fill the central region of the memory layer 81 or the first dummy memory layer 81$d$1 corresponding to the channel layer 83.

One gate stack structure GST may be spaced apart from another gate stack structure GST adjacent thereto by the slit SI. A depth of the upper slit USI passing through an upper part of the gate stack structure GST may be smaller than a depth of the slit SI in the third direction D3. According to an embodiment, the upper slit USI may be deep enough to pass through at least the uppermost conductive pattern CPn among the conductive patterns CP1 to CPn. However, embodiments are not limited thereto. For example, the upper slit USI may pass through one or more conductive patterns successively disposed under the nth conductive pattern CPn. A conductive pattern, for example, CPn, which is penetrated by the upper silt USI, may be separated into select lines. The conductive patterns which serve as the word lines WL shown in FIG. 5A might not be penetrated by the upper slit USI.

The first contact plugs PCT1 may pass through the stepped structure of the gate stack structure GST. The first insulating structure IS1 surrounding each of the first contact plugs PCT1 may include a second dummy memory layer 81$d$2 that includes the same material as the memory layer 81. The first insulating structure IS1 may further include an oxide layer 95 disposed between the second dummy memory layer 81$d$2 and the first contact plug PCT1 corresponding to the second dummy memory layer 81$d$2.

Each of the channel structures CH, the supporting pillars SP, and the first contact plugs PCT1 may be formed in a hole passing through the gate stack structure GST. According to an embodiment, the hole may have a structure in which a lower hole and an upper hole are coupled together. The lower hole may be defined as a part passing through a first stack structure G1 that forms a lower part of the gate stack structure GST and the upper hole may be defined as a part passing through a second stack structure G2 that forms an upper part of the gate stack structure GST. The interlayer insulating layers 41 and 63 may be classified into first interlayer insulating layers 41 included in the first stack structure G1 and second interlayer insulating layers 63 included in the second stack structure G2. The conductive patterns CP1 to CPn may include conductive patterns of a first group (CP1 to CPk) included in the first stack structure G1 and conductive patterns of a second group (CPk+1 to CPn) included in the second stack structure G2, where k is a natural number less than n. The lower hole may be deep enough to pass through the first stack structure G1, and the upper hole may be deep enough to pass through the second stack structure G2. An etching process for forming each of the lower hole and the upper hole may be easier than an etching process for forming a hole having a depth to pass through both the first and second stack structures G1 and G2. When the lower hole and the upper hole are separately formed as described above, an undercut region may be defined at a boundary between the lower hole and the upper hole. Embodiments are not limited to the structure in which the undercut region is defined at the boundary between the lower hole and the upper hole, and a sidewall of each of the channel structures CH, the supporting pillars SP, and the first contact plugs PCT1 may be substantially flat.

The conductive patterns CP1 to CPn of the gate stack structure GST may be coupled to the gate contact plugs GCT. The gate contact plugs GCT may be coupled to parts of the conductive patterns CP1 to CPn forming the stepped structure, respectively, and may extend in the third direction D3.

A rise defined by the stepped structure may be covered by a gap-fill insulating structure. The gap-fill insulating structure may include a first gap-fill insulating layer 50 covering a rise defined by the first stack structure G1 and a second gap-fill insulating layer 68 covering a rise defined by the second stack structure G2. The gap-fill insulating structure and the gate stack structure GST may be covered by an upper insulating layer 99. The channel structures CH may extend to pass through the upper insulating layer 99. Each of the supporting pillars SP, the gate contact plugs GCT, and the first contact plugs PCT1 may pass through the upper insulating layer 99, and the first and second gap-fill insulating layers 50 and 68 of the gap-fill insulating structure.

The gate stack structure GST may be disposed on semiconductor patterns 20A and 20B separated from each other by an insulating layer 35. The semiconductor patterns 20A and 20B may include a first semiconductor pattern 20A and second semiconductor patterns 20B.

Each of the first and second semiconductor patterns 20A and 20B may include a first semiconductor layer 21 and a second semiconductor layer 29. The second semiconductor layer 29 may be spaced apart from the first semiconductor layer 21 and may extend along the bottom surface of the gate stack structure GST. The first semiconductor pattern 20A may include a channel coupling pattern 121 disposed between the first semiconductor layer 21 and the second semiconductor layer 29 corresponding to the first semiconductor pattern 20A, and each of the second semiconductor patterns 20B may include a sacrificial stack structure SA disposed between the first semiconductor layer 21 and the second semiconductor layer 29. The sacrificial stack structure SA may include a first protective layer 23, a sacrificial layer 25, and a second protective layer 27 sequentially stacked over the first semiconductor layer 21.

The first semiconductor layer 21 and the channel coupling pattern 121 may include an n-type or p-type impurity. According to an embodiment, the channel coupling pattern 121 and the first semiconductor layer 21 including an n-type impurity may be used for a gate induced drain leakage (GIDL) erase method that performs an erase operation by using a GIDL. According to an embodiment, the channel coupling pattern 121 and the first semiconductor layer 21 including a p-type impurity may be used for a well erase method that performs an erase operation by supplying a hole. The second semiconductor layer 29 may be an undoped semiconductor layer or a doped semiconductor layer including the same type of impurity as the first semiconductor layer 21 and the channel coupling pattern 121. The sacrificial layer 25 may include a material having a different etch rate from the first protective layer 23 and the second protective layer 27 to selectively etch the sacrificial layer 25. For example, the sacrificial layer 25 may include an undoped silicon layer. Each of the first protective layer 23 and the second protective layer 27 may include an oxide layer.

The first semiconductor pattern 20A may extend to overlap the slit SI and the channel structures CH. The slit SI may pass through the second semiconductor layer 29 of the first semiconductor pattern 20A. An oxide layer 125 may be formed between the slit SI and the first semiconductor pattern 20A.

The first semiconductor pattern 20A may extend to overlap the supporting pillars SP. The first semiconductor pattern 20A may overlap a part of the stepped structure penetrated by the supporting pillars SP.

The channel structures CH and the supporting pillars SP may extend into the first semiconductor pattern 20A. According to an embodiment, the channel structures CH and the supporting pillars SP may extend into the first semiconductor layer 21 of the first semiconductor pattern 20A.

The memory layer 81 may be divided into a first memory pattern P1 and a second memory pattern P2. The first memory pattern P1 may be disposed between the channel structure CH corresponding to the first memory pattern P1 and the first semiconductor layer 21 of the first semiconductor pattern 20A, and the second memory pattern P2 may be disposed between the channel structure CH corresponding to the second memory pattern P2 and the gate stack structure GST.

The first dummy memory layer 81d1 may be divided into a first dummy pattern P1d and a second dummy pattern P2d. The first dummy pattern P1d may be disposed between the supporting pillar SP corresponding to the first dummy pattern P1d and the first semiconductor layer 21 of the first semiconductor pattern 20A, and the second dummy pattern P2d may be disposed between the supporting pillar SP corresponding to the second dummy pattern P2d and the gate stack structure GST.

The first semiconductor layer 21 of the first semiconductor pattern 20A may surround a lower part of each of the channel structures CH and a lower part of each of the supporting pillars SP. The second semiconductor layer 29 of the first semiconductor pattern 20A may extend along the bottom surface of the gate stack structure GST to surround the channel structures CH and the supporting pillars SP. The channel coupling pattern 121 may extend between the first memory pattern P1 and the second memory pattern P2 to contact the channel structures CH. The channel coupling pattern 121 may extend between the first dummy pattern Ptd and the second dummy pattern Ptd to contact the supporting pillars SP.

The second semiconductor patterns 20B may be penetrated by the first contact plugs PCT1. A width of each of the second semiconductor patterns 20B may be greater than a width of the first contact plug PCT1. The first semiconductor layer 21, the first protective layer 23, the sacrificial layer 25, the second protective layer 27, and the second semiconductor layer 29 of each of the second semiconductor patterns 20B may surround the first contact plug PCT1. Each of the first contact plugs PCT1 may pass through the first insulating structure IS1 and may extend farther than the first insulating structure IS1.

A first vertical doped semiconductor pattern 31A may be formed on a sidewall of the first semiconductor pattern 20A, and a second vertical doped semiconductor pattern 31B may be formed on a sidewall of each of the second semiconductor patterns 20B. The first vertical doped semiconductor pattern 31A and the second vertical doped semiconductor pattern 31B may include an n-type or p-type impurity. According to an embodiment, the first vertical doped semiconductor pattern 31A and the second vertical doped semiconductor pattern 31B may include the same type of impurity as the first semiconductor layer 21.

The semiconductor patterns 20A and 20B may be disposed on a lower insulating layer 10 penetrated by lower contact plugs 11A and 11B. The lower contact plugs 11A and 11B may include a first lower contact plug 11A coupled to the first semiconductor pattern 20A and second lower contact plugs 11B coupled to the first contact plugs PCT1, respectively.

The first semiconductor pattern 20A and the first vertical doped semiconductor pattern 31A may overlap the first lower contact plug 11A, and each of the first contact plugs PCT1 and each of the second semiconductor patterns 20B may overlap the second lower contact plug 11B. Each of the first contact plugs PCT1 may pass through the second semiconductor pattern 20B to contact the second lower contact plug 11B.

Figure 4:
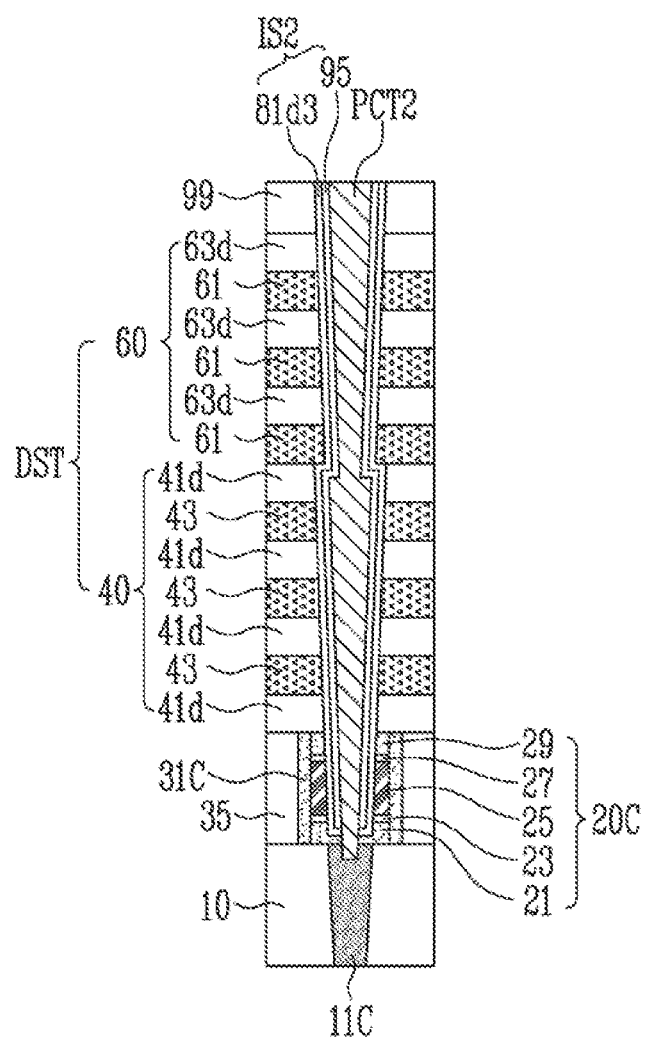
FIG. 4 is a cross-sectional diagram illustrating a part of a semiconductor memory device according to an embodiment.

FIG. 4 is a cross-sectional diagram illustrating a part of a semiconductor memory device according to an embodiment. The part of the semiconductor memory device shown in FIG. 4 may overlap the second region A2 shown in FIG. 1.

Referring to FIG. 4, the lower insulating layer 10 and the insulating layer 35 described with reference to FIGS. 3A to 3C may extend to overlap the second region A2 described with reference to FIG. 1.

The lower contact plugs passing through the lower insulating layer 10 may further include a third lower contact plug 11C. The semiconductor patterns divided by the insulating layer 35 may further include a third semiconductor pattern 20C.

The third semiconductor pattern 20C may include the same material as the second semiconductor pattern 20B shown in FIG. 3B. The third semiconductor pattern 20C may include the first semiconductor layer 21, the first protective layer 23, the sacrificial layer 25, the second protective layer 27, and the second semiconductor layer 29 that are sequentially stacked on one another. The third semiconductor pattern 20C may overlap the third lower contact plug 11C. A third vertical doped semiconductor pattern 31C may be formed on a sidewall of the third semiconductor pattern 20C. The third vertical doped semiconductor pattern 31C may include the same type of impurity as the first semiconductor layer 21.

The third semiconductor pattern 20C and the third vertical doped semiconductor pattern 31C may be covered by a dummy stack structure DST. The dummy stack structure DST may include dummy interlayer insulating layers 41d and 63d and sacrificial layers 43 and 61 alternately stacked over the third semiconductor pattern 20C and the third vertical doped semiconductor pattern 31C. The dummy interlayer insulating layers 41d and 63d may include the same material as the interlayer insulating layers 41 and 63 described with reference to FIGS. 3A to 3C, and the dummy interlayer insulating layers 41d may be disposed in the same level as the interlayer insulating layers 41 and the dummy interlayer insulating layers 63d may be disposed in the same level as the interlayer insulating layers 63. The sacrificial layers 43 and 61 may be disposed in the same level as the conductive patterns CP1 to CPn described with reference to FIGS. 3A to 3C, respectively. The sacrificial layers 43 and 61 may include material having a different etch rate from the dummy interlayer insulating layers 41d and 63d to selectively etch the sacrificial layers 43 and 61. For example, each of the sacrificial layers 43 and 61 may include a nitride layer.

The dummy stack structure DST and the third semiconductor pattern 20C may be penetrated by a second contact plug PCT2. The second contact plug PCT2 may extend to contact the third lower contact plug 11C.

A sidewall of the second contact plug PCT2 may be surrounded by a second insulating structure IS2. The second insulating structure IS2 may include the same material as the first insulating structure IS1 described with reference to FIG. 3B. According to an embodiment, the second insulating structure IS2 may include a third dummy memory layer 81d3 having the same material as the memory layer 81 shown in FIGS. 3A and 3B, and the oxide layer 95 disposed between the third dummy memory layer 81d3 and the second contact plug PCT2.

The second contact plug PCT2 may be formed in a hole passing through the dummy stack structure DST. The hole may be formed by a forming process of a lower hole that passes through a lower stack structure 40 forming a lower part of the dummy stack structure DST, and by a forming process of an upper hole that passes through an upper stack structure 60 forming an upper part of the dummy stack structure DST. According to this embodiment, an undercut region may be defined at a boundary between the lower hole and the upper hole. Embodiments are not limited to the structure in which the undercut region is defined at the boundary between the lower hole and the upper hole, and a sidewall of the second contact plug PCT2 may be substantially flat. Embodiments are not limited to a method of manufacturing the hole by the forming process of the lower hole and the forming process of the upper hole.

The upper insulating layer 99 described with reference to FIGS. 3A to 3C may extend to cover the dummy stack structure DST and may be penetrated by the second contact plug PCT2. A width of the third semiconductor pattern 20C may be greater than a width of the second contact plug PCT2.

The first, second, and third lower contact plugs 11A, 11B, and 11C and the first and second contact plugs PCT1 and PCT2 shown in FIGS. 3A to 3C and 4 may include various conductive materials capable of transmitting an electrical signal.

Figure 5B:
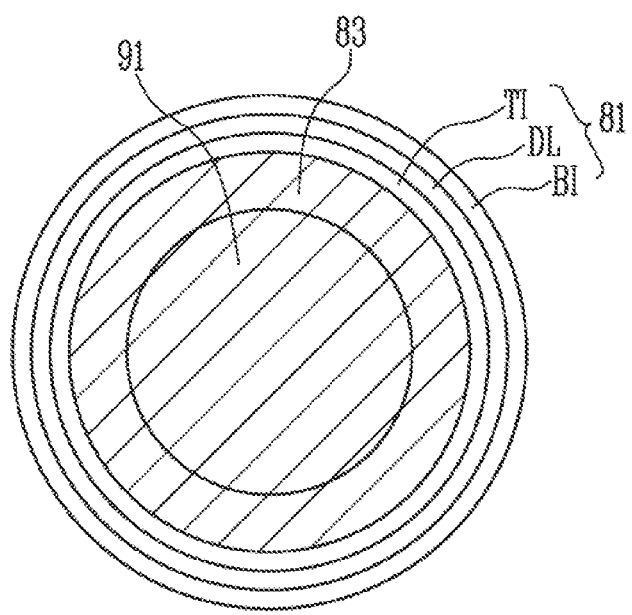
FIG. 5B is a diagram illustrating a memory layer according to an embodiment.

FIG. 5A is a diagram illustrating a memory string according to an embodiment, and FIG. 5B is a diagram illustrating a memory layer according to an embodiment.

Referring to FIG. 5A, a memory string may be coupled to the plurality of word lines WL and the select lines SSL and DSL. The select lines SSL and DSL may include at least one source select line SSL and at least one drain select line DSL. The word lines WL may be disposed between the source select line SSL and the drain select line DSL. The source select line SSL may be coupled to a gate electrode of a source select transistor, the drain select line DSL may be coupled to a gate electrode of a drain select transistor, and the word lines WL may be coupled to gate electrodes of memory cells.

The conductive patterns CP1 to CPn described with reference to FIGS. 3A to 3C may form the source select line SSL, the word lines WL, and the drain select line DSL. According to an embodiment, among the conductive patterns CP1 to CPn, the first conductive pattern CP1 adjacent to the first semiconductor pattern 20A may serve as the source select line SSL and the nth conductive pattern CPn disposed farthest from the first semiconductor pattern 20A may serve as the drain select line DSL. Conductive patterns between the source select line SSL and the drain select line DSL may serve as the word lines WL. According to an embodiment, one or more conductive patterns successively disposed over the first conductive pattern CP1 may serve as another source select line, and one or more conductive patterns successively disposed under the nth conductive pattern CPn may serve as another drain select line.

According to the structure described above, a drain select transistor may be formed in an intersection of the drain select line DSL and the channel structure CH, a source select transistor may be formed in an intersection of the source select line SSL and the channel structure CH, and memory cells may be formed in intersections of the word lines WL and the channel structure CH. The memory cells may be coupled in series between the source select transistor and the drain select transistor by the channel layer 83 of the channel structure CH. The source select transistor may be coupled to the channel coupling pattern 121 of the first semiconductor pattern 20A by the channel layer 83. The capping pattern 91 of the channel structure CH may serve as a junction of the drain select transistor.

The memory layer 81 may extend between the channel structure CH and each of the first semiconductor layer 21 and the second semiconductor layer 29 of the first semiconductor pattern 20A. Each of the first memory pattern P1 and the second memory pattern P2 of the memory layer 81 may include a tunnel insulating layer TI, a data storage layer DL, and a blocking insulating layer BI as shown in FIG. 5B.

FIG. 5B illustrates a cross section of the memory layer 81 surrounding the channel layer 83.

Referring to FIG. 5B, the central region of the memory layer 81 may be filled with the channel layer 83, the core insulating pattern 85, and the capping pattern 91 shown in FIG. 5A. The tunnel insulating layer TI of the memory layer 81 may surround the channel layer 83, the data storage layer DL of the memory layer 81 may surround the tunnel insulating layer TI, and the blocking insulating layer BI of the memory layer 81 may surround the data storage layer DL.

The data storage layer DL may include a material layer capable of storing data changed by using Fowler-Nordheim tunneling. The data storage layer DL may include various materials, for example, a charge trap layer. The charge trap layer may include a nitride layer. Embodiments are not limited thereto, and the data storage layer DL may include a phase-change material, nanodots, or the like. The blocking insulating layer BI may include an oxide layer capable of blocking charges. The tunnel insulating layer TI may include a silicon oxide layer enabling charge tunneling.

Each of the first dummy memory layer 81d1 shown in FIG. 3A, the second dummy memory layer 81d2 shown in FIG. 3B, and the third dummy memory layer 81d3 shown in FIG. 4 may include the same material layers as the tunnel insulating layer TI, the data storage layer DL, and the blocking insulating layer BI described above.

FIG. 6 is a cross-sectional diagram illustrating a lower structure LS of a semiconductor memory device according to an embodiment.

Referring to FIG. 6, the lower structure LS may be disposed between the substrate 201 including the first region A1 and the second region A2 and the lower insulating layer 10 penetrated by the first, second, and third lower contact plugs 11A, 11B, and 11C.

The lower structure LS may include the plurality of transistors TR, a discharge impurity region DCI, and interconnection structures 221. The plurality of transistors TR may be formed over active regions. The active regions and the discharge impurity region DCI may be separated from each other by isolation layers 203 formed in the substrate 201. The interconnection structures 221 may be connected to the transistors TR and the discharge impurity region DCI. The discharge impurity region DCI and the transistors TR may be covered by an insulating-layer stack structure 220 in which two or more insulating layers are stacked and the interconnection structures 221 may pass through the insulating-layer stack structure 220.

The discharge impurity region DCI may be formed in the substrate 201. The discharge impurity region DCI may be connected to the first lower contact plug 11A via the interconnection structure 221 corresponding to the discharge impurity region DCI. The discharge impurity region DCI may be provided to discharge charges accumulated in the first semiconductor pattern 20A.

Each of the transistors TR may include a gate insulating layer 211, the gate electrode 213, and the junctions JN. The gate insulating layer 211 and the gate electrode 213 of each of the transistors TR may be stacked over an active region. The junctions JN of the transistors TR may be formed by injecting an n-type or p-type impurity into active regions that protrude at opposite sides of the corresponding gate electrode 213.

Each of the first contact plugs PCT1 passing through the stepped region STA of the gate stack structure GST may be connected to the transistor TR via the second lower contact plug 11B and the interconnection structure 221.

A transistor disposed in the second region A2 among the transistors TR may be connected to the second contact plug PCT2 passing through the dummy stack structure DST via the interconnection structure 221 and the third lower contact plug 11C corresponding to the transistor disposed in the second region A2.

Figure 7:
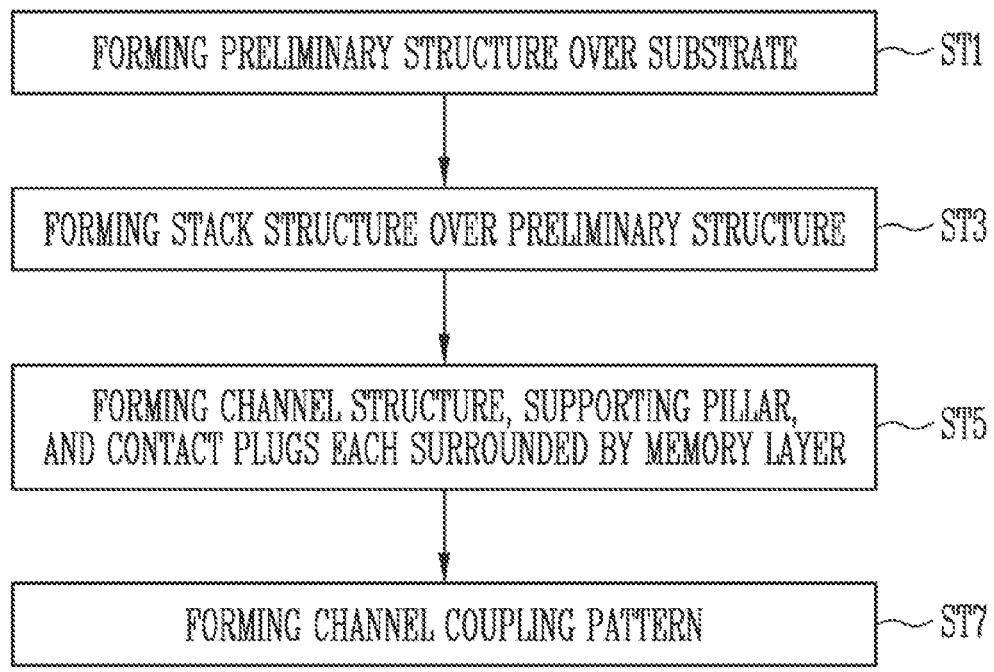
FIG. 7 is a flowchart schematically illustrating a method of manufacturing a semiconductor memory device according to an embodiment.

FIG. 7 is a flowchart schematically illustrating a method of manufacturing a semiconductor memory device according to an embodiment.

Referring to FIG. 7, a method of manufacturing a semiconductor memory device may include step ST1 for forming a preliminary structure, step ST3 for forming a stack structure, step ST5 for forming a channel structure, a supporting pillar, and contact plugs, and step ST7 for forming a channel coupling pattern.

A substrate including a lower structure and lower contact plugs may be formed before step ST1 is performed. The lower structure may include the lower structure LS described with reference to FIG. 6, and the lower contact plugs may include the first, second, and third lower contact plugs 11A, 11B, and 11C described with reference to FIGS. 3A to 3C, 4, and 6. The preliminary structure may be formed over the substrate including the lower structure and the lower contact plugs at step ST1.

At step ST3, the stack structure may be formed to have a stepped structure, and may be penetrated by a channel hole, a dummy hole, and contact holes. According to an embodiment, step ST3 may include forming a first stepped structure which forms a lower part of the stack structure and forming a second stepped structure which forms an upper part of the stack structure. However, embodiments are not limited thereto. According to an embodiment, step ST3 may include stacking a plurality of material layers as much as a height of a target stack structure and forming a stepped structure by etching the plurality of material layers.

Step ST5 may include forming a memory layer on a sidewall of each of the channel hole, the dummy hole, and the contact holes, forming a channel structure and a supporting pillar in the channel hole and the dummy hole, respectively, and forming contact plugs in the contact holes. Accordingly, each of the channel structure, the supporting pillar, and the contact plugs may be surrounded by the memory layer.

Step ST7 may include partially exposing the sidewall of the channel structure and forming a channel coupling pattern contacting the exposed sidewall of the channel structure.

Hereinafter, a method of manufacturing a semiconductor memory device according to an embodiment is described with reference to FIGS. 8A to 8C, 9A to 9J, 10A to 10K, 11A to 11C, 12A, 12B, 13, 14A, and 14B. The figures below are cross-sectional diagrams of structures according to manufacturing steps. The figures below are cross-sectional diagrams taken along line I-I', line II-II', and line III-III' and corresponding to the second region A2. The figures below illustrate an embodiment regarding a method of manufacturing a semiconductor memory device including the structures shown in FIGS. 3A to 3C and 4.

Figure 8A:
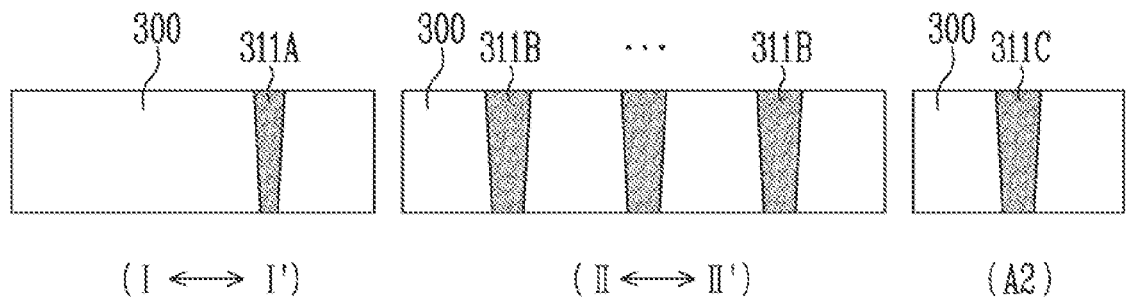
FIGS. 8A to 8C are cross-sectional diagrams illustrating an embodiment regarding step ST1 shown in FIG. 7.
Figure 8B:
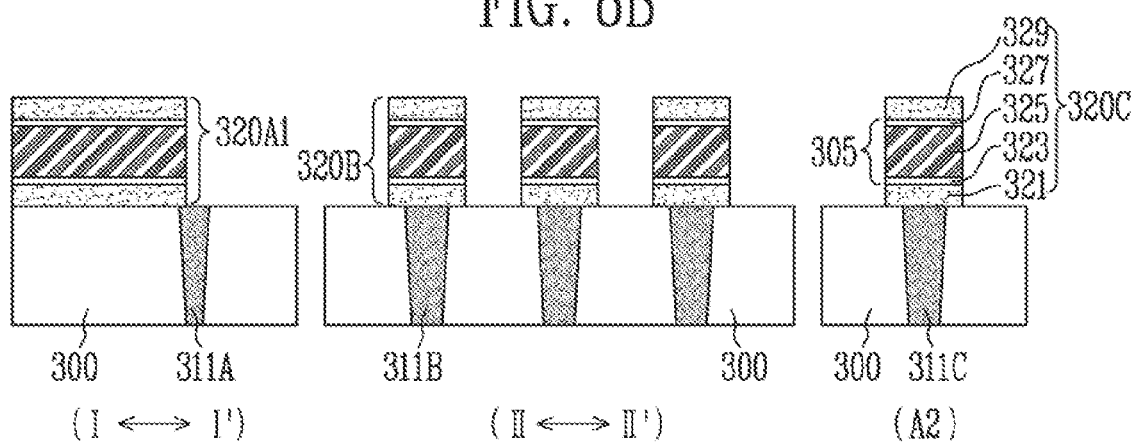
Figure 8C:
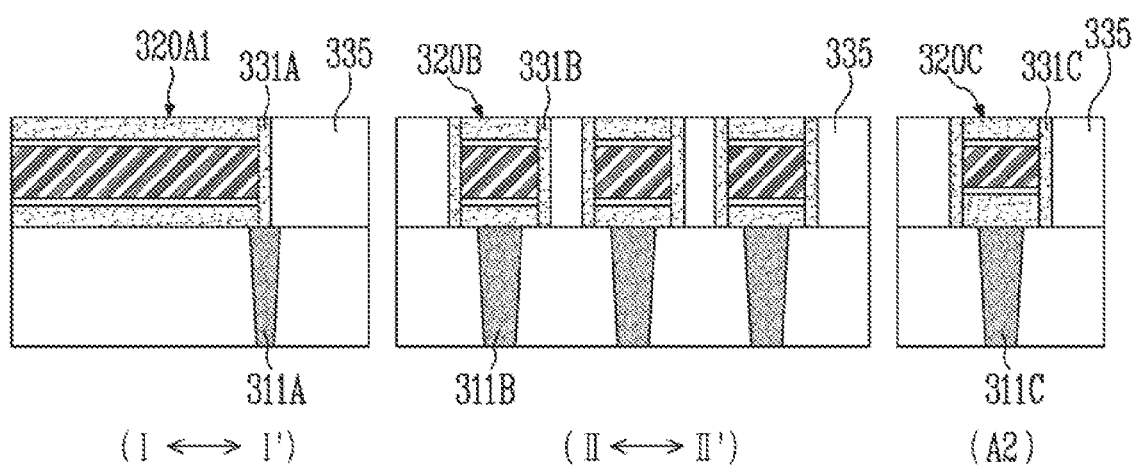

FIGS. 8A to 8C are cross-sectional diagrams illustrating an embodiment regarding step ST1 shown in FIG. 7.

Referring to FIG. 8A, lower contact plugs 311A, 311B, and 311C passing through a lower insulating layer 300 may be formed over the substrate 201 including the lower structure LS shown in FIG. 6 before step ST1 is performed. The lower contact plugs 311A, 311B, and 311C may include various conductive materials capable of transmitting an electrical signal.

The lower contact plugs 311A, 311B, and 311C may include a first lower contact plug 311A, a second lower contact plug 311B, and a third lower contact plug 311C. The first lower contact plug 311A may be connected to the discharge impurity region DCI shown in FIG. 6. The second lower contact plug 311B and the third lower contact plug 311C may be connected to corresponding transistors, respectively, among the transistors TR of the peripheral circuit shown in FIG. 6.

Referring to FIG. 8B, step ST1 may include forming a preliminary first semiconductor pattern 320A1, a second semiconductor pattern 320B, and a third semiconductor pattern 320C separated from each other.

The preliminary first semiconductor pattern 320A1 may overlap the first lower contact plug 311A, the second semiconductor pattern 320B may overlap the second lower contact plug 311B, and the third semiconductor pattern 320C may overlap the third lower contact plug 311C. An edge of the preliminary first semiconductor pattern 320A1 may overlap the first lower contact plug 311A. A width of the second semiconductor pattern 320B may be greater than a width of the second lower contact plug 311B and the second semiconductor pattern 320B may protrude toward opposite sides of the second lower contact plug 311B. A width of the third semiconductor pattern 320C may be greater than a width of the third lower contact plug 311C and the third semiconductor pattern 320C may protrude toward opposite sides of the third lower contact plug 311C.

Forming the preliminary first semiconductor pattern 320A1, the second semiconductor pattern 320B, and the third semiconductor pattern 320C may include sequentially stacking a first semiconductor layer 321, a sacrificial stack structure 305, and a second semiconductor layer 329 over the lower insulating layer 300 to cover the first, second, and third lower contact plugs 311A, 311B, and 311C and etching the first semiconductor layer 321, the sacrificial stack structure 305, and the second semiconductor layer 329.

The first semiconductor layer 321 may include an n-type or p-type impurity. The sacrificial stack structure 305 may include a first protective layer 323, a sacrificial layer 325, and a second protective layer 327 that sequentially stacked on each other. The sacrificial layer 325 may include a material having a different etch rate from the first protective layer 323 and the second protective layer 327 to selectively etch the sacrificial layer 325, and the first protective layer 323 and the second protective layer 327 may include a material capable of protecting the first semiconductor layer 321 and the second semiconductor layer 329 when the sacrificial layer 325 is etched. For example, the sacrificial layer 325 may include an undoped silicon layer. Each of the first protective layer 323 and the second protective layer 327 may include an oxide layer. The second semiconductor layer 329 may include an undoped semiconductor layer or a doped semiconductor layer including an n-type or p-type impurity. At least one of the first protective layer 323, the second protective layer 327, and the second semiconductor layer 329 may be omitted.

Referring to FIG. 8C, step ST1 may include forming a first vertical doped semiconductor pattern 331A, a second vertical doped semiconductor pattern 331B, and a third vertical doped semiconductor pattern 331C on sidewalls of the preliminary first semiconductor pattern 320A1, the second semiconductor pattern 320B, and the third semiconductor pattern 320C, respectively. The first, second, and third vertical doped semiconductor patterns 331A, 331B, and 331C may include the same impurity as the first semiconductor layer 321 described with reference to FIG. 8B.

Step ST1 may include filling spaces among the preliminary first semiconductor pattern 320A1, the second and third semiconductor patterns 320B and 320C with an insulating layer 335.

The preliminary structure including the preliminary first semiconductor pattern 320A1 and the second and third semiconductor patterns 320B and 320C that overlap the first, second, and third lower contact plugs 311A, 311B, and 311C, respectively, and that are separated from each other by the insulating layer 335 may be formed by the processes described above with reference to FIGS. 8A to 8C.

FIGS. 9A to 9J are cross-sectional diagrams illustrating an embodiment regarding step ST3 shown in FIG. 7.

Referring to FIG. 9A, step ST3 may include forming a first stack structure 340 on the preliminary structure. The first stack structure 340 may include first interlayer insulating layers 341 and first sacrificial layers 343 alternately stacked on each other. The first interlayer insulating layers 341 may include a first material layer and the first sacrificial layers 343 may include a second material layer. The second material layer may include an insulating material having a different etch rate from the first material layer to selectively etch the second material layer. For example, the first material layer may include an oxide layer and the second material layer may include a nitride layer.

Referring to FIG. 9B, step ST3 may include etching the first stack structure 340 to form a first stepped structure SW1.

Referring to FIG. 9C, step ST3 may include forming a first gap-fill insulating layer 350 covering the first stepped structure SW1 shown in FIG. 9B. A rise defined by the first stepped structure SW1 may be covered by the first gap-fill insulating layer 350.

Figure 9D:
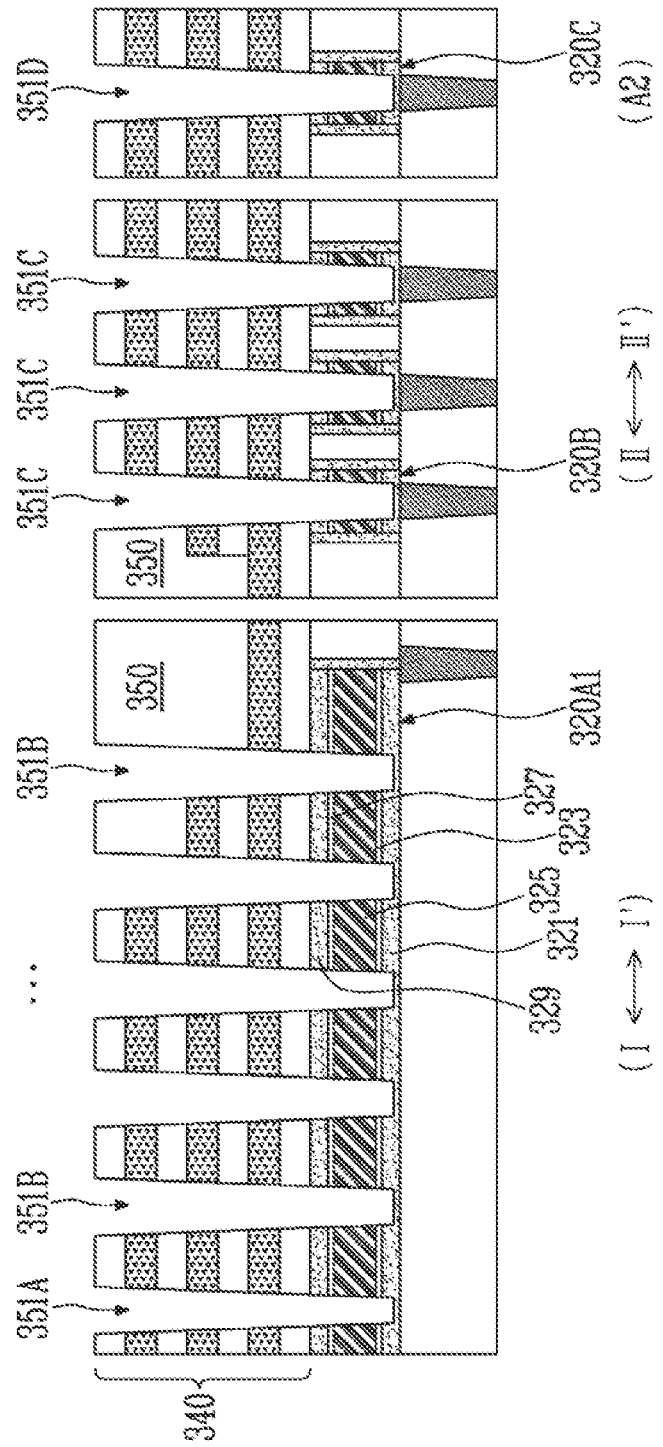

Referring to FIG. 9D, step ST3 may include forming lower holes 351A to 351D. The lower holes 351A to 351D may be simultaneously formed. The lower holes 351A to 351D may include a first lower hole 351A, a second lower hole 351B, a third lower hole 351C, and a fourth lower hole 351D.

The first lower hole 351A may pass through the first stack structure 340 and may extend into the preliminary first semiconductor pattern 320A1. The first lower hole 351A may pass through the second semiconductor layer 329, the second protective layer 327, the sacrificial layer 325, and the first protective layer 323 of the preliminary first semiconductor pattern 320A1 and may extend into the first semiconductor layer 321.

The second lower hole 351B may pass through the first gap-fill insulating layer 350 covering the first stepped structure SW1 shown in FIG. 9B and the first stepped structure SW1 under the first gap-fill insulating layer 350 or may pass through a part of the first stack structure 340 adjacent to the first stepped structure SW1. The second lower hole 351B may pass through the second semiconductor layer 329, the second protective layer 327, the sacrificial layer 325, and the first protective layer 323 of the preliminary first semiconductor pattern 320A1 and may extend into the first semiconductor layer 321.

The third lower hole 351C may pass through a part of the first stack structure 340 overlapping the second semiconductor pattern 320B. The third lower hole 351C may pass through a part of the first stepped structure SW1 shown in FIG. 9B and the first gap-fill insulating layer 350 over the part of the first stepped structure SW1. The third lower hole 351C may pass through the second semiconductor layer 329, the second protective layer 327, the sacrificial layer 325, and the first protective layer 323 of the second semiconductor pattern 320B and may extend into the first semiconductor layer 321. A width of the third lower hole 351C may be smaller than a width of the second semiconductor pattern 320B.

The fourth lower hole 351D may pass through a part of the first stack structure 340 overlapping the third semiconductor pattern 320C. The fourth lower hole 351D may pass through the second semiconductor layer 329, the second protective layer 327, the sacrificial layer 325, and the first protective layer 323 of the third semiconductor pattern 320C and may extend into the first semiconductor layer 321. A width of the fourth lower hole 351D may be smaller than a width of the third semiconductor pattern 320C.

When an etching process for forming the first, second, third, and fourth lower holes 351A, 351B, 351C, and 351D is performed, each of the preliminary first semiconductor pattern 320A1 and the second and third semiconductor patterns 320B and 320C may serve as an etch stop layer.

Referring to FIG. 9E, step ST3 may include filling the first, second, third, and fourth lower holes 351A, 351B, 351C, and 351D with vertical sacrificial layers 353. The vertical sacrificial layers 353 may include a material having a different etch rate from the first material layer and the second material layer described above with reference to FIG. 9A to selectively remove the vertical sacrificial layers 353. According to an embodiment, the vertical sacrificial layers 353 may include metal such as tungsten.

Figure 9F:
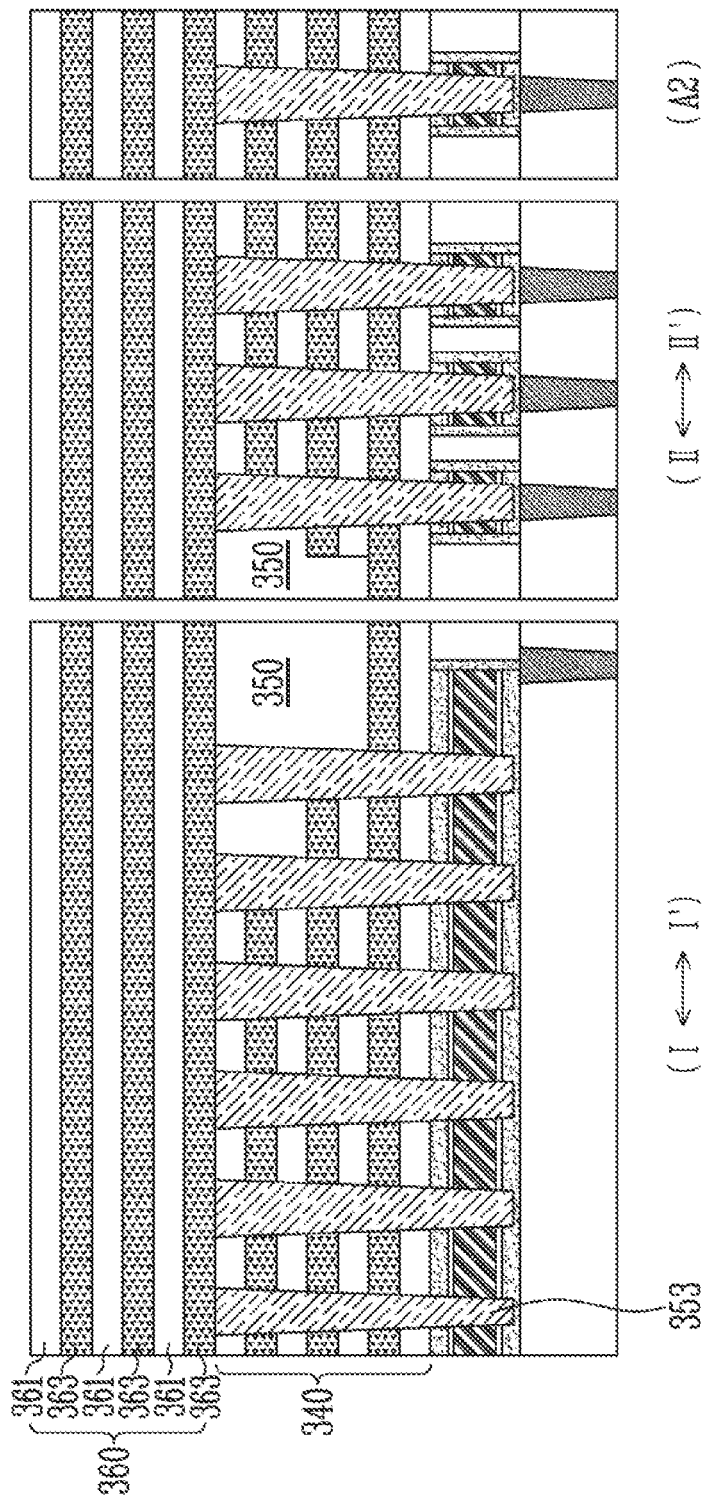

Referring to FIG. 9F, step ST3 may include forming a second stack structure 360 on the first stack structure 340 having the first stepped structure that is penetrated by the vertical sacrificial layers 353 and covered by the first gap-fill insulating layer 350. The second stack structure 360 may include second sacrificial layers 363 and second interlayer insulating layers 361 alternately stacked on each other. The second interlayer insulating layers 361 may include the first material layer described with reference to FIG. 9A and the second sacrificial layers 363 may include the second material layer described with reference to FIG. 9A.

Figure 9G:
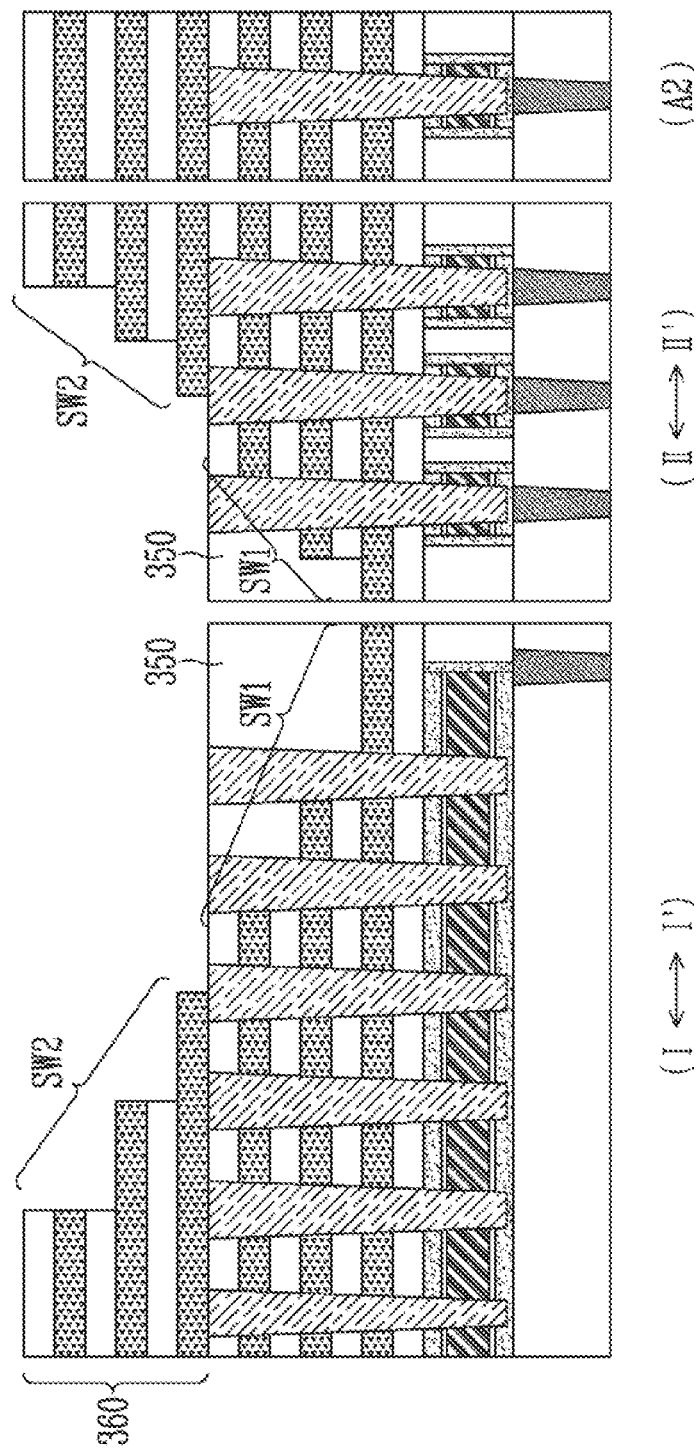

Referring to FIG. 9G, step ST3 may include etching the second stack structure 360 to form a second stepped structure SW2. A part of the second stack structure 360 which overlaps the first stepped structure SW1 may be removed and the first stepped structure SW1 might not overlap the second stack structure 360 having the second stepped structure SW2.

Figure 9H:
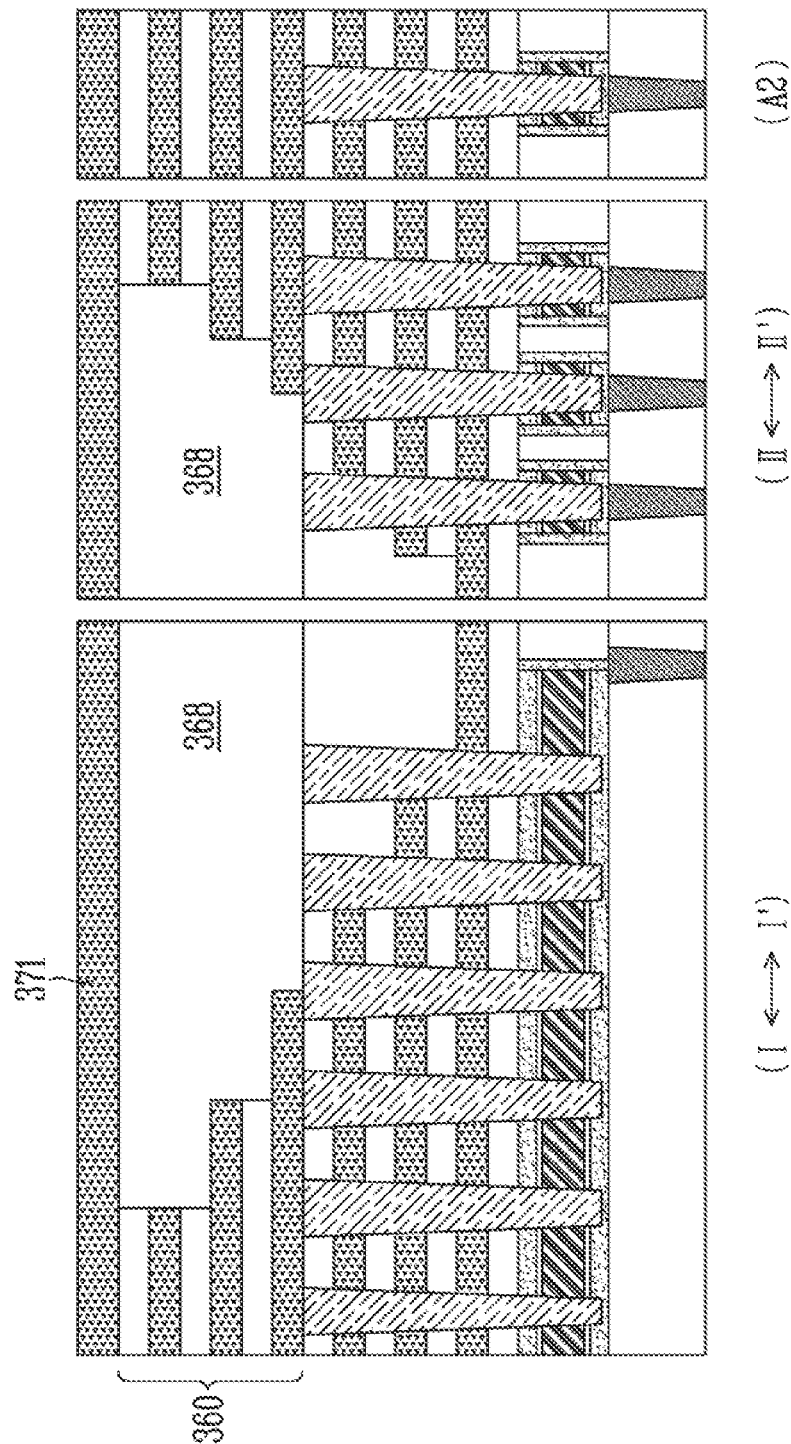

Referring to FIG. 9H, step ST3 may include forming a second gap-fill insulating layer 368 covering the second stepped structure SW2 shown in FIG. 9G. A rise defined by the second stepped structure SW2 may be covered by the second gap-fill insulating layer 368. Subsequently, a first mask layer 371 may be formed to cover the second gap-fill insulating layer 368 and the second stack structure 360. The first mask layer 371 may include a nitride layer.

Referring to FIG. 9I, step ST3 may include forming upper holes 373A to 373D. The upper holes 373A to 373D may be simultaneously formed. The upper holes 373A to 373D may include a first upper hole 373A coupled to the first lower hole 351A, a second upper hole 373B coupled to the second lower hole 351B, a third upper hole 373C coupled to the third lower hole 351C, and a fourth upper hole 373D coupled to the fourth lower hole 351D.

The first, second, third, and fourth upper holes 373A, 373B, 373C, and 373D may be formed by etching the first mask layer 371, the second stack structure 360, and the second gap-fill insulating layer 368 to expose the vertical sacrificial layers 353. The first upper hole 373A may pass through the second stack structure 360. The second upper hole 373B may pass through the second stepped structure SW2 shown in FIG. 9G or may pass through the second gap-fill insulating layer 368 overlapping the first stepped structure SW1 shown in FIG. 9G. The third upper hole 373C may pass through the second stepped structure of the second stack structure 360 that overlaps the third lower hole 351C or may pass through the second gap-fill insulating layer 368 that overlaps the third lower hole 351C. The fourth upper hole 373D may pass through a part of the second stack structure 360 that overlaps the fourth lower hole 351D.

Referring to FIG. 9J, step ST3 may include removing the vertical sacrificial layers 353 shown in FIG. 9I through the first, second, third, and fourth upper holes 373A, 373B, 373C, and 373D shown in FIG. 9I. Accordingly, a channel hole HA, a dummy hole HB, a first contact hole HC, and a second contact hole HD may be opened.

The channel hole HA may be defined by coupling the first lower hole 351A to the first upper hole 373A shown in FIG. 9I and may expose the first semiconductor layer 321 of the preliminary first semiconductor pattern 320A1. The dummy hole HB may be defined by coupling the second lower hole 351B to the second upper hole 373B shown in FIG. 9I and may expose the first semiconductor layer 321 of the preliminary first semiconductor pattern 320A1. The first contact hole HC may be defined by coupling the third lower hole 351C to the third upper hole 373C shown in FIG. 9I and may expose the first semiconductor layer 321 of the second semiconductor pattern 320B. The second contact hole HD may be defined by coupling the fourth lower hole 351D to the fourth upper hole 373D shown in FIG. 9I and may expose the first semiconductor layer 321 of the third semiconductor pattern 320C.

A stepped stack structure 379 having a stepped structure and penetrated by the channel hole HA, the dummy hole HB, the first contact hole HC, and the second contact hole HD may be formed by the processes described above with reference to FIGS. 9A to 9J. The channel hole HA, the dummy hole HB, the first and second contact holes HC and HD may be formed such that the channel hole HA and the dummy hole HB overlap the preliminary first semiconductor pattern 320A1, the first contact hole HC overlaps the second semiconductor pattern 320B, and the second contact hole HD overlaps the third semiconductor pattern 320C.

FIGS. 10A to 10K are cross-sectional diagrams illustrating an embodiment regarding step ST5 shown in FIG. 7.

Figure 10A:
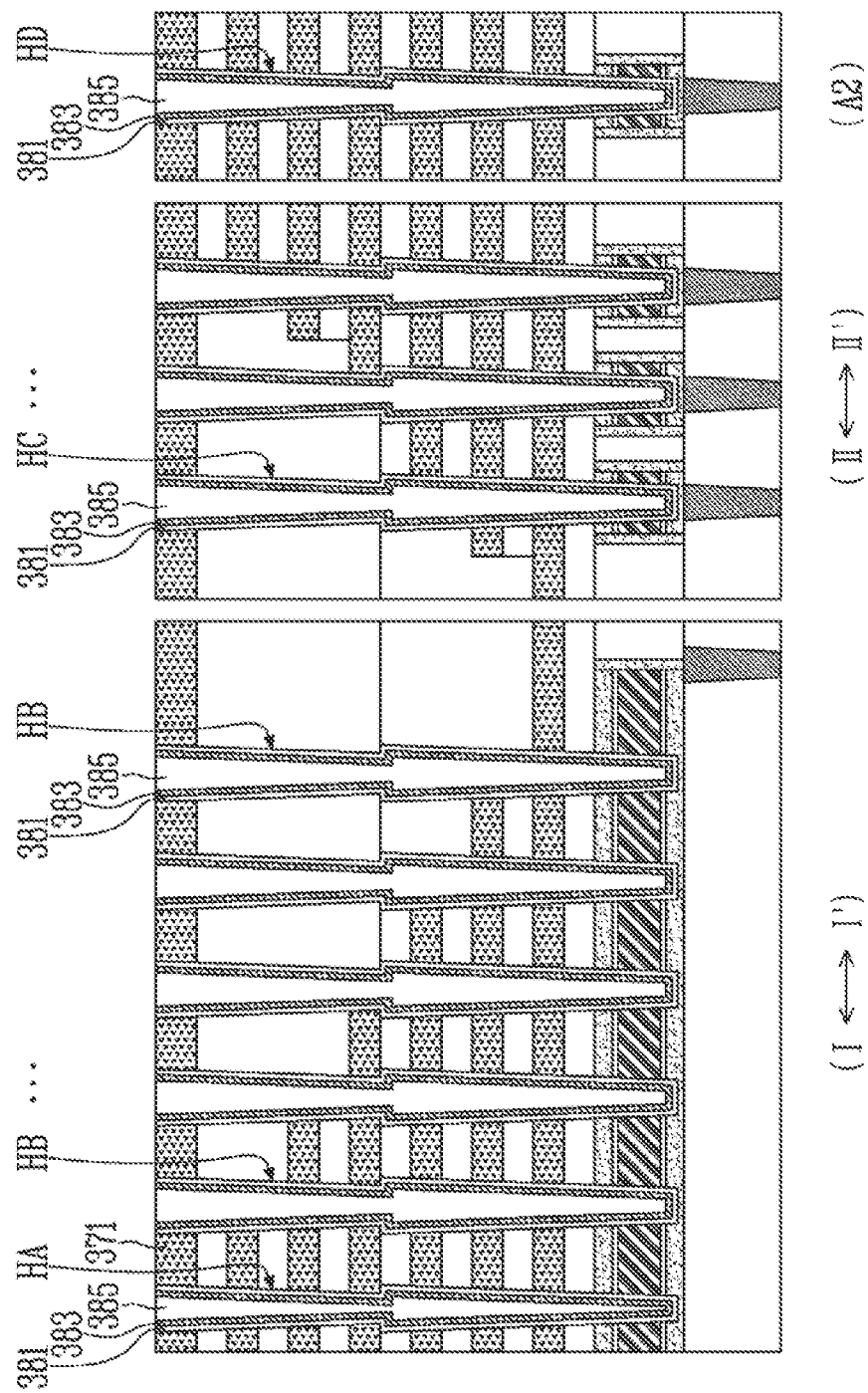

Referring to FIG. 10A, step ST5 may include forming a memory layer 381 on a surface of each of the channel hole HA, the dummy hole HB, the first contact hole HC, and the second contact hole HD, forming a channel layer 383 on the memory layer 381, and filling the central region of the channel layer 383 with a core insulating layer 385.

The memory layer 381 may be formed by sequentially stacking the blocking insulating layer BI, the data storage layer DL, and the tunnel insulating layer TI described with reference to FIG. 5B. The memory layer 381 may be simultaneously formed on the surfaces of the channel hole HA, the dummy hole HB, the first contact hole HC, and the second contact hole HD.

According to an embodiment, the channel layer 383 may be conformally formed on the memory layer 381 and the core insulating layer 385 may be formed by filling the central region of each of the channel hole HA, the dummy hole HB, the first contact hole HC, and the second contact hole HD, which is not filled with the channel layer 383, with a flowable material layer and then by hardening the flowable material layer. The flowable material layer may include polysilazane (PSZ).

Referring to FIG. 10B, step ST5 may include removing an upper end of the core insulating layer 385 shown in FIG. 10A to define a hollow portion HP in an upper end of each of the channel hole HA, the dummy hole HB, the first contact hole HC, and the second contact hole HD. Accordingly, a core insulating pattern 385P opening the upper end of the channel layer 383 may be defined.

Subsequently, step ST5 may include forming a doped semiconductor layer 391L to fill the hollow portion HP. The doped semiconductor layer 391L may include at least one of an n-type impurity and a p-type impurity.

Figure 10C:
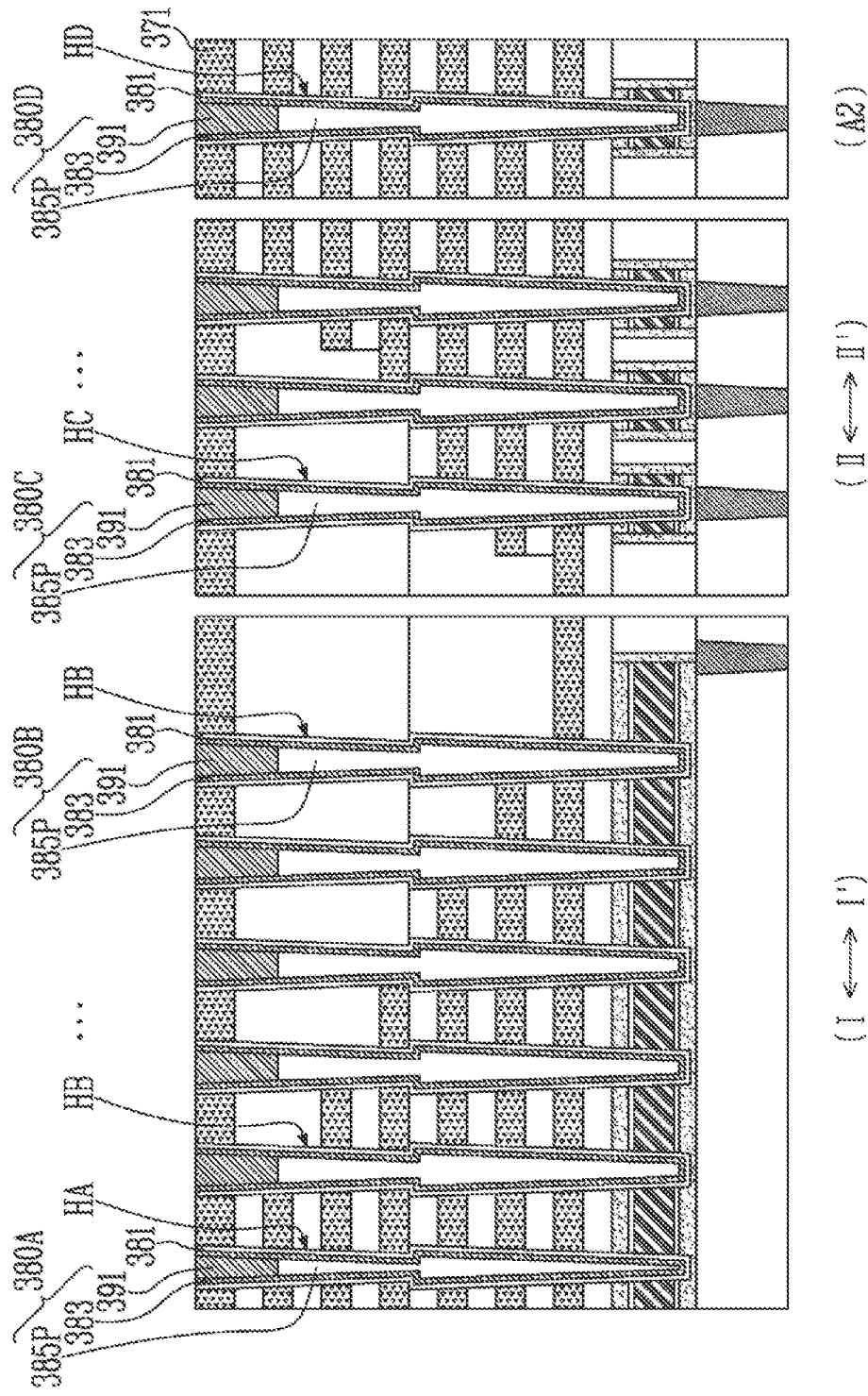

Referring to FIG. 10C, step ST5 may include planarizing the doped semiconductor layer 391L shown in FIG. 10B to expose the first mask layer 371. Accordingly, a capping pattern 391 surrounded by the upper end of the channel layer 383 may be formed.

A channel structure 380A may be formed in the channel hole HA, a supporting pillar 380B may be formed in the dummy hole HB, and a first dummy channel structure 380C and a second dummy channel structure 380D may be formed in the first contact hole HC and the second contact hole HD, respectively, by the processes described with reference to FIGS. 10A to 10C. According to an embodiment, each of the channel structure 380A, the supporting pillar 380B, the first and second dummy channel structures 380C and 380D may include the channel layer 383, the core insulating pattern 385P, and the capping pattern 391.

Although not illustrated in FIG. 10C, according to an embodiment, the capping pattern 391 may be omitted and each of the channel structure 380A, the supporting pillar 380B, and the first and second dummy channel structures 380C and 380D may include the channel layer 383 filling the central region of the memory layer 381.

Figure 10D:
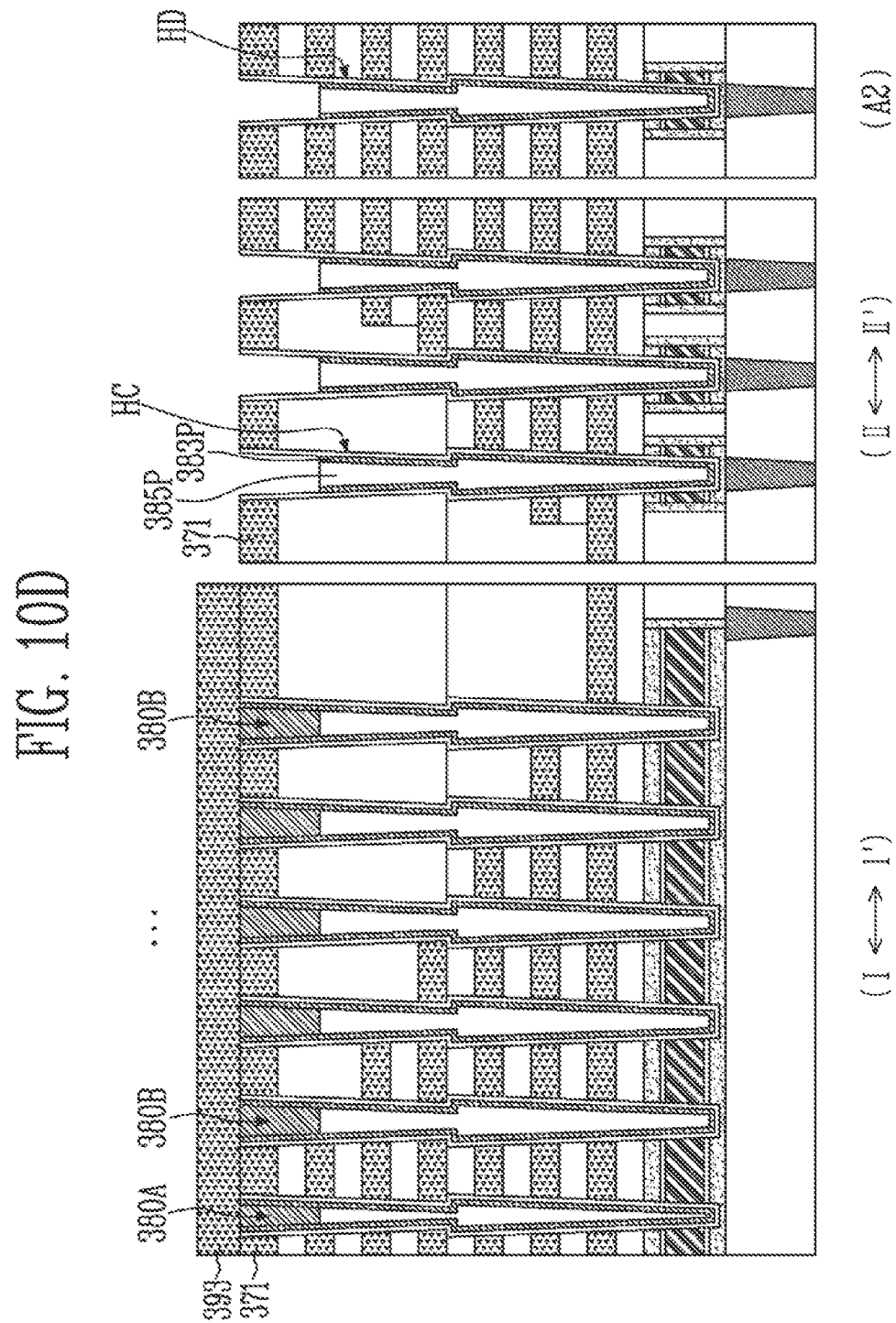

Referring to FIG. 10D, step ST5 may include forming a second mask layer 393 extending to cover the channel structure 380A and the supporting pillar 380B on the first mask layer 371. The second mask layer 393 may be etched to expose the first dummy channel structure 380C and the second dummy channel structure 380D shown in FIG. 10C.

Subsequently, step ST5 may include removing the capping pattern 391 shown in FIG. 10C from each of the first contact hole HC and the second contact hole HD by an etching process using the second mask layer 393 as an etching barrier. Accordingly, the core insulating pattern 385P may be exposed. When the capping pattern 391 is etched, the upper end of the channel layer 383 shown in FIG. 10C may be removed from the first contact hole HC and the second contact hole HD and a part of the channel layer 383P may remain.

Figure 10E:
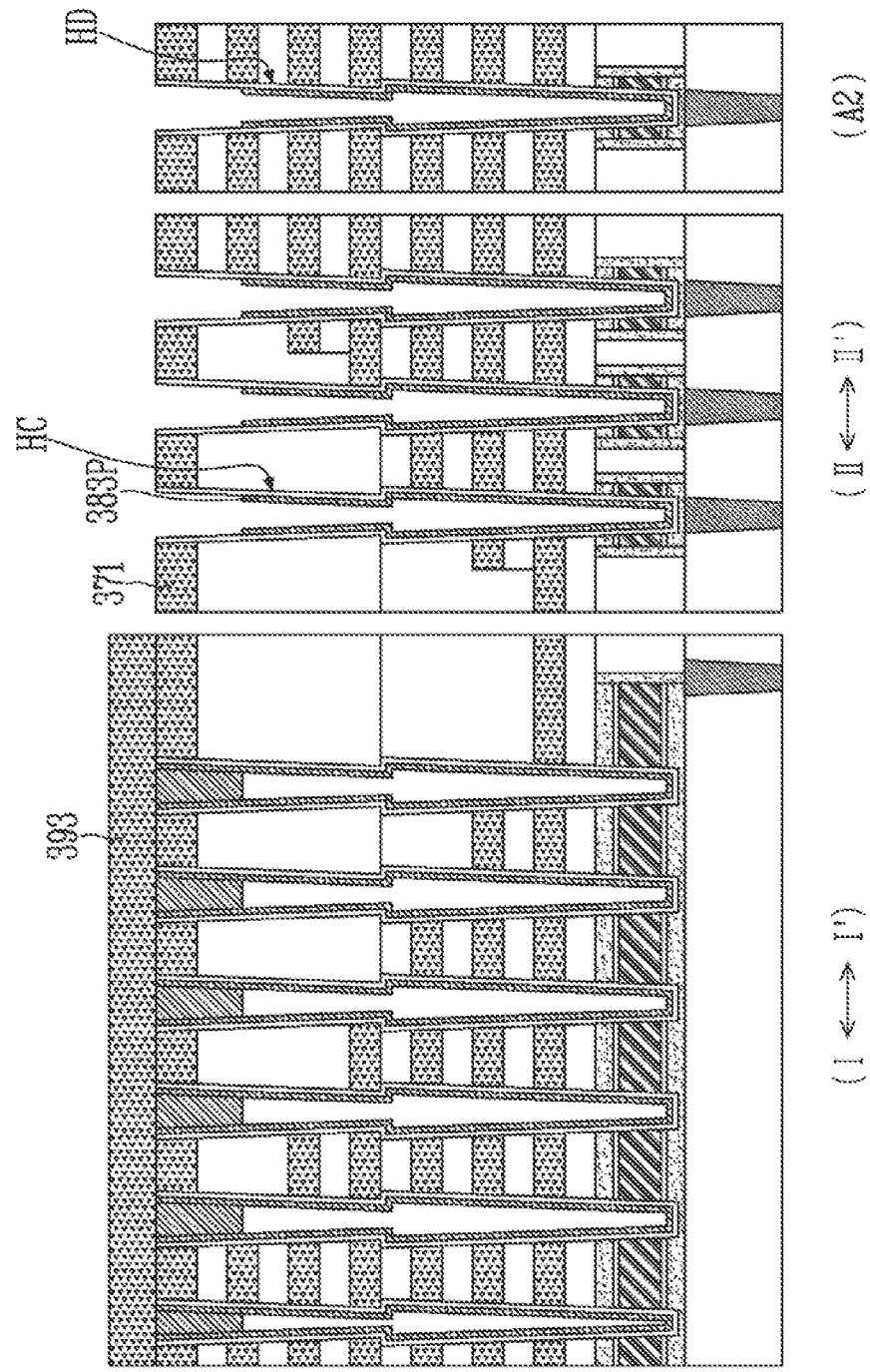

Referring to FIG. 10E, step ST5 may include removing the core insulating pattern 385P shown in FIG. 10D from each of the first contact hole HC and the second contact hole HD by an etching process using the second mask layer 393 as an etching barrier.

Figure 10F:
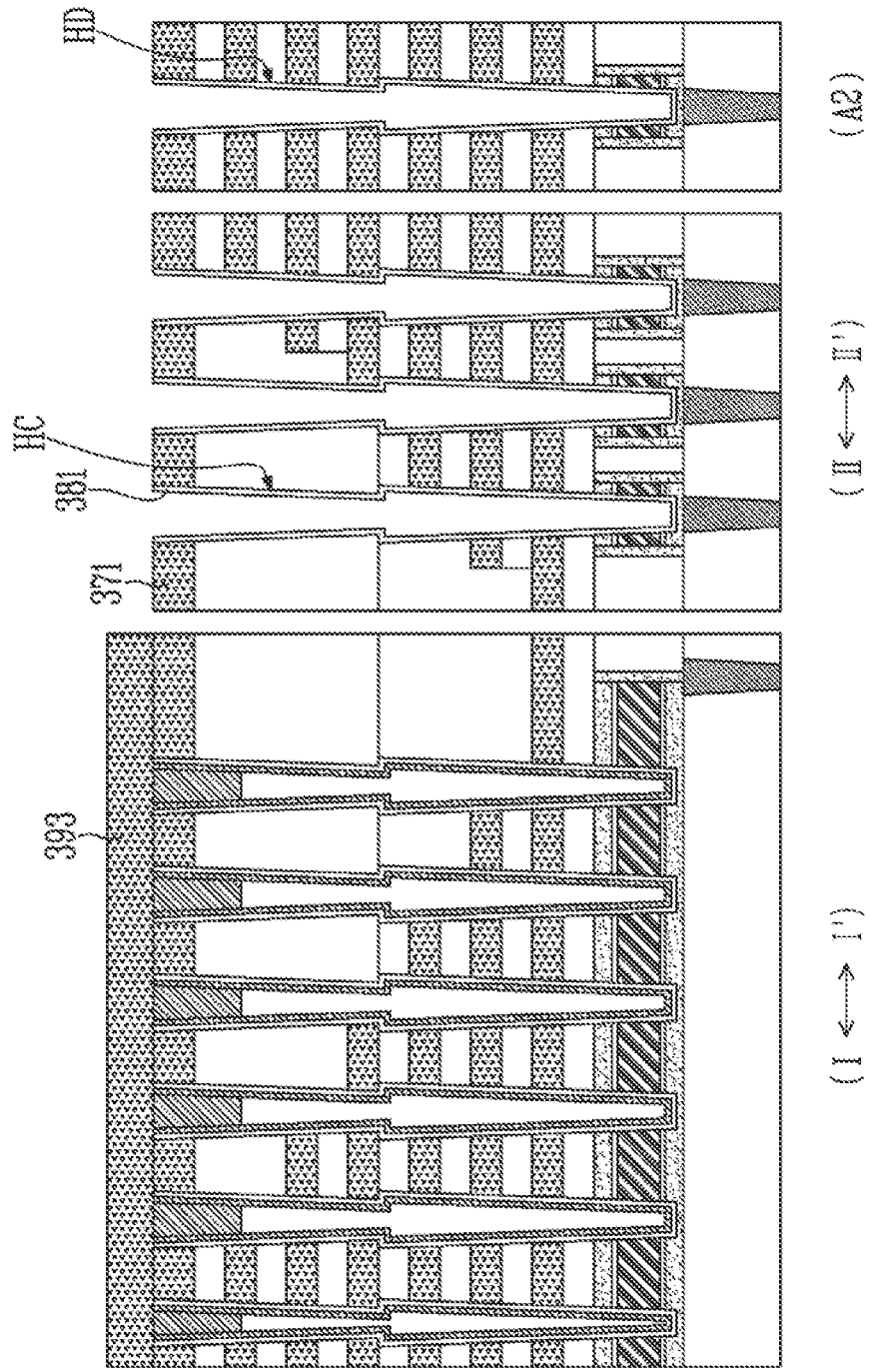

Referring to FIG. 10F, step ST5 may include removing the channel layer 383P shown in FIG. 10E from each of the first contact hole HC and the second contact hole HD by an etching process using the second mask layer 393 as an etching barrier. Accordingly, the memory layer 381 formed along the surface of each of the first contact hole HC and the second contact hole HD may be exposed.

Referring to FIG. 10G, step ST5 may include forming an oxide layer 395 on the memory layer 381 exposed on the surface of each of the first contact hole HC and the second contact hole HD. The oxide layer 395 may be formed to compensate for insulation characteristics of the memory layer 381. According to an embodiment, forming the oxide layer 395 may be omitted.

Figure 10H:
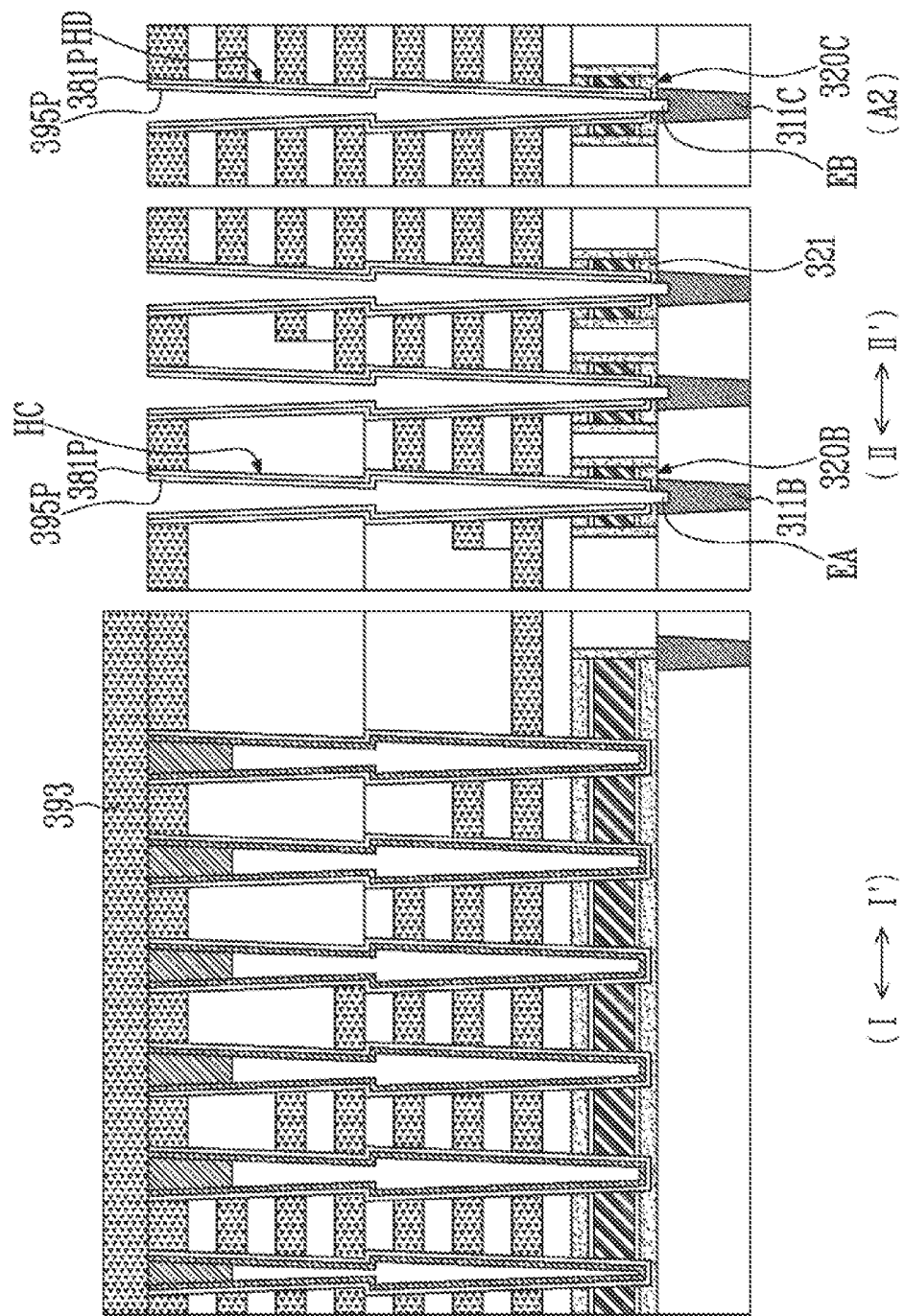

Referring to FIG. 10H, step ST5 may include forming a first contact hole extending portion EA coupled to the first contact hole HC and a second contact hole extending portion EB coupled to the second contact hole HD.

The first contact hole extending portion EA may pass through the memory layer 381 and the oxide layer 395 of the bottom surface of the first contact hole HC and pass through the first semiconductor layer 321 of the second semiconductor pattern 320B to expose the second lower contact plug 311B. The second contact hole extending portion EB may pass through the memory layer 381 and the oxide layer 395 of the bottom surface of the second contact hole HD and pass through the first semiconductor layer 321 of the third semiconductor pattern 320C to expose the third lower contact plug 311C. Hereinafter, a memory layer and an oxide layer remaining in each of the first and second contact holes HC and HD may be referred to as a dummy memory layer 381P and an oxide layer pattern 395P.

Figure 10I:
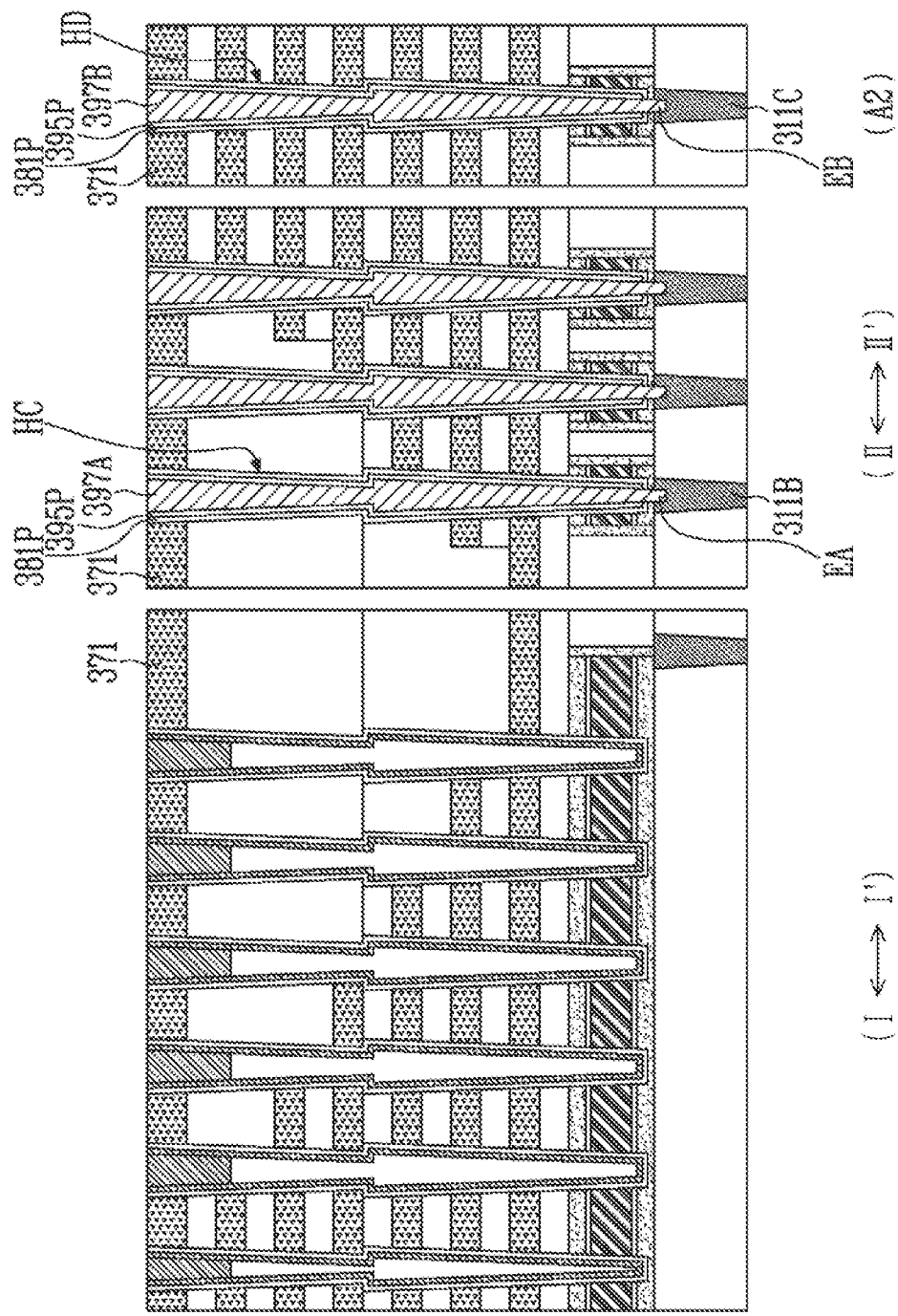

Referring to FIG. 10I, step ST5 may include forming a first contact plug 397A filling the first contact hole HC and the first contact hole extending portion EA and a second contact plug 397B filling the second contact hole HD and the second contact hole extending portion EB.

The first contact plug 397A and the second contact plug 397B may include various conductive materials capable of transmitting an electrical signal. The first contact plug 397A may contact the second lower contact plug 311B and the second contact plug 397B may contact the third lower contact plug 311C. When the first contact plug 397A and the second contact plug 397B are formed, the second mask layer 393 shown in FIG. 10H may be removed.

Figure 10J:
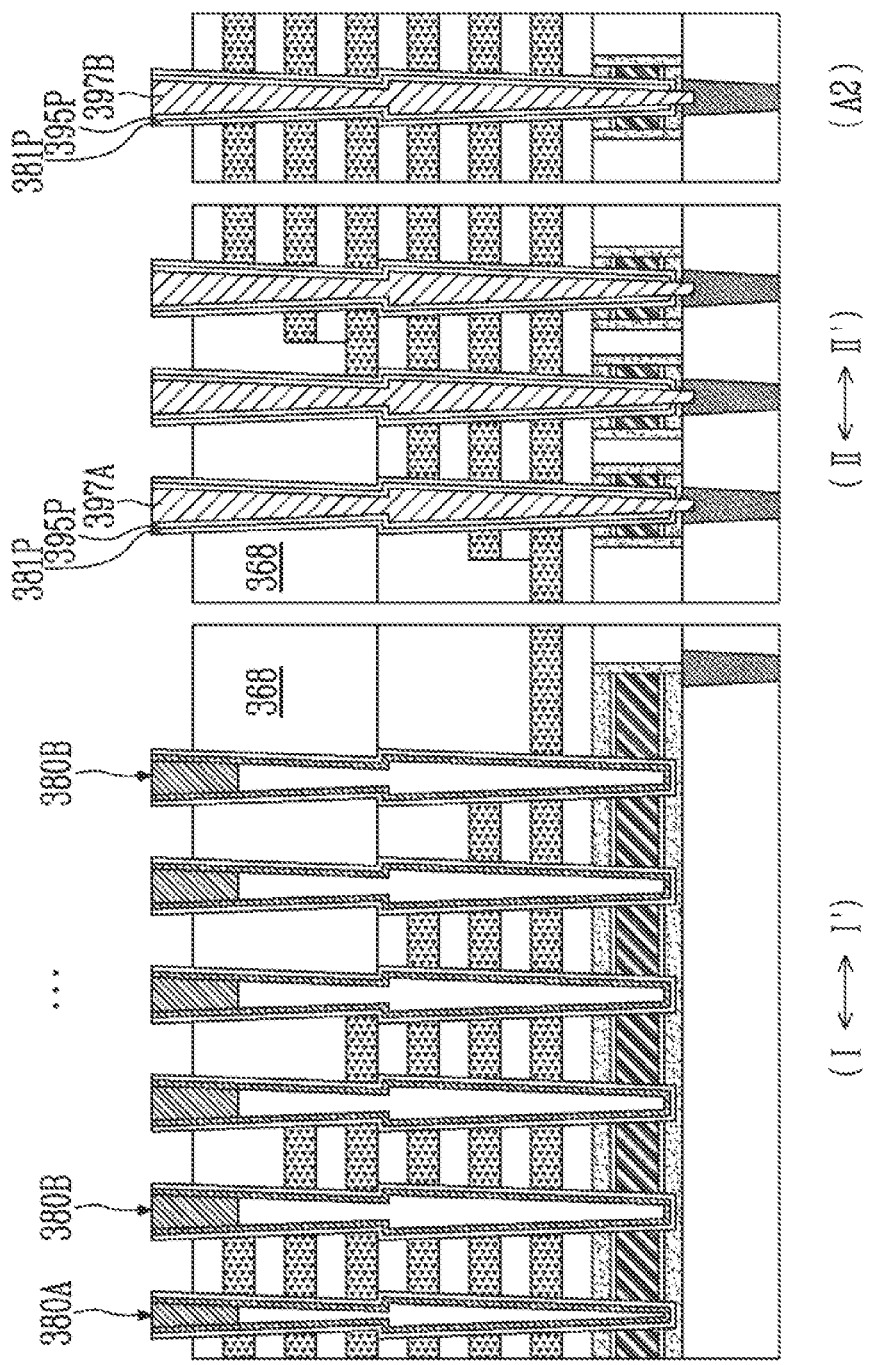

Referring to FIG. 10J, after the first contact plug 397A and the second contact plug 397B are formed, the first mask layer 371 shown in FIG. 10I may be removed.

Figure 10K:
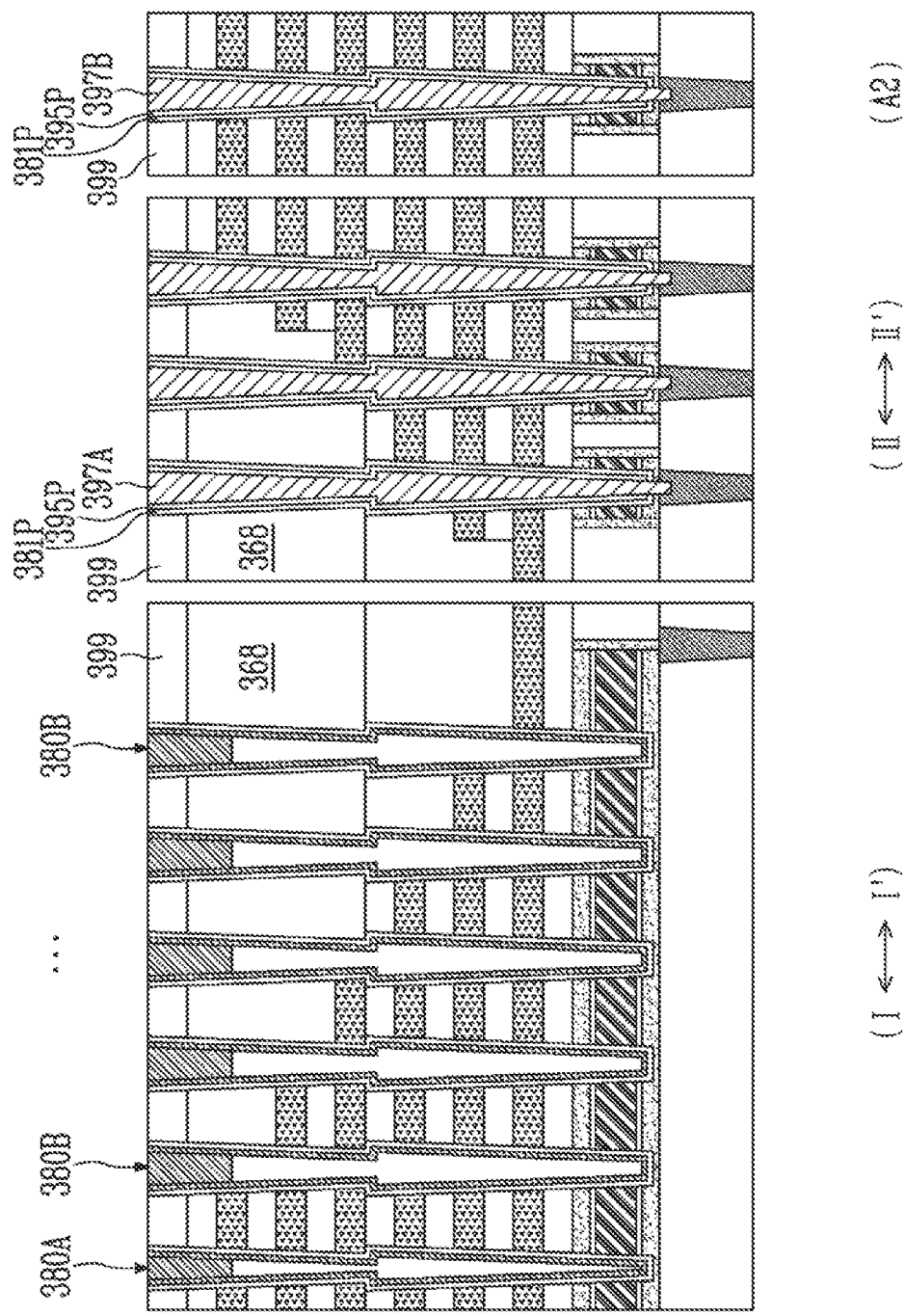

Referring to FIG. 10K, a region from which the first mask layer is removed may be filled with a first upper insulating layer 399. The first upper insulating layer 399 may surround upper ends of the channel structure 380A, the supporting pillar 380B, the first contact plug 397A, and the second contact plug 397B.

As described above with reference to FIGS. 10A to 10I, the dummy memory layer 381P surrounding each of the first contact plug 397A and the second contact plug 397B may be formed by a process of forming the memory layer 381 that surrounds the channel structure 380A. The dummy memory layer 381P may serve as an insulating structure to insulate the first contact plug 397A and the second contact plug 397B.

Figure 11A:
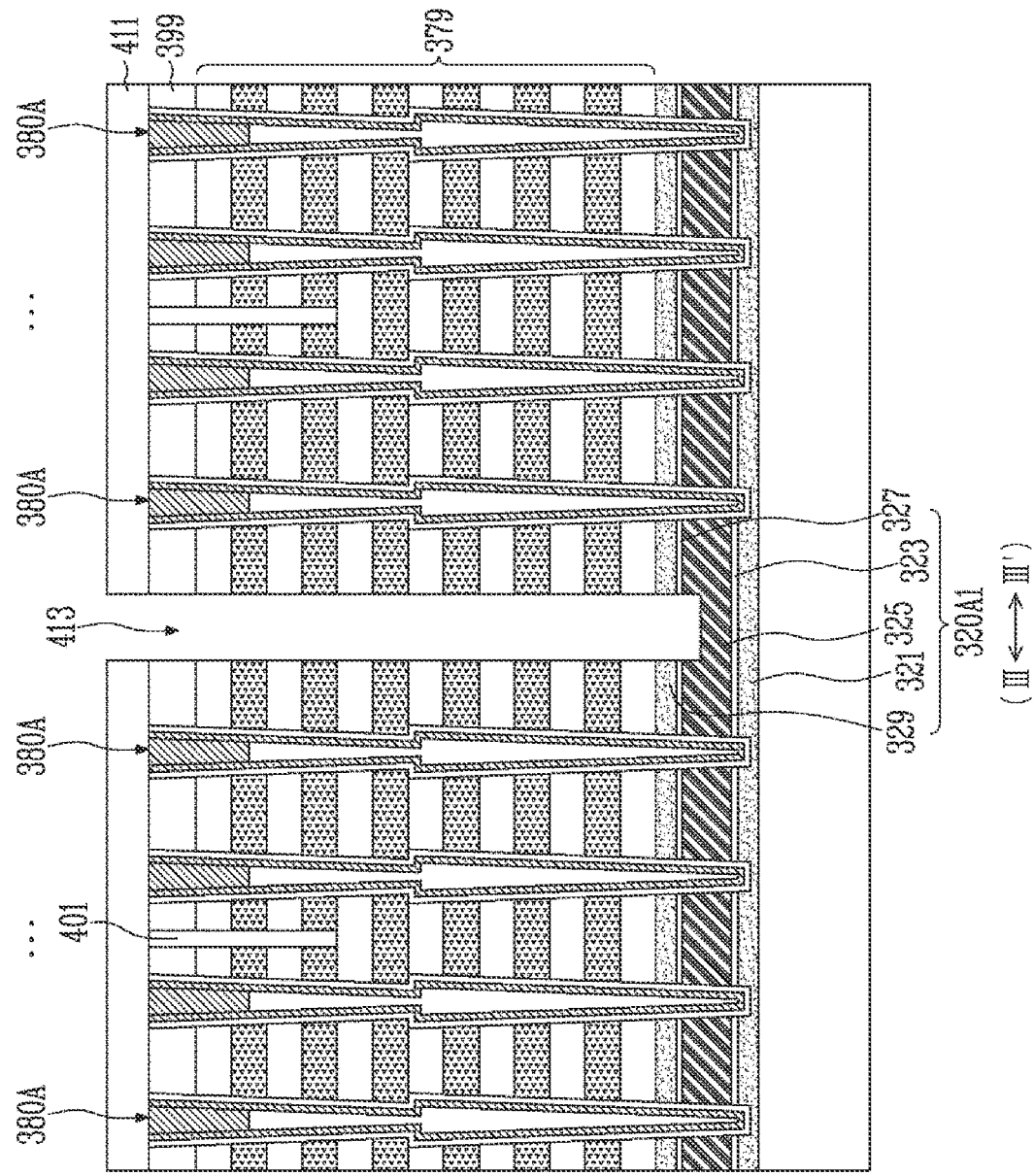
FIGS. 11A to 11C are cross-sectional diagrams illustrating an embodiment regarding step ST7 shown in FIG. 7.
Figure 11B:
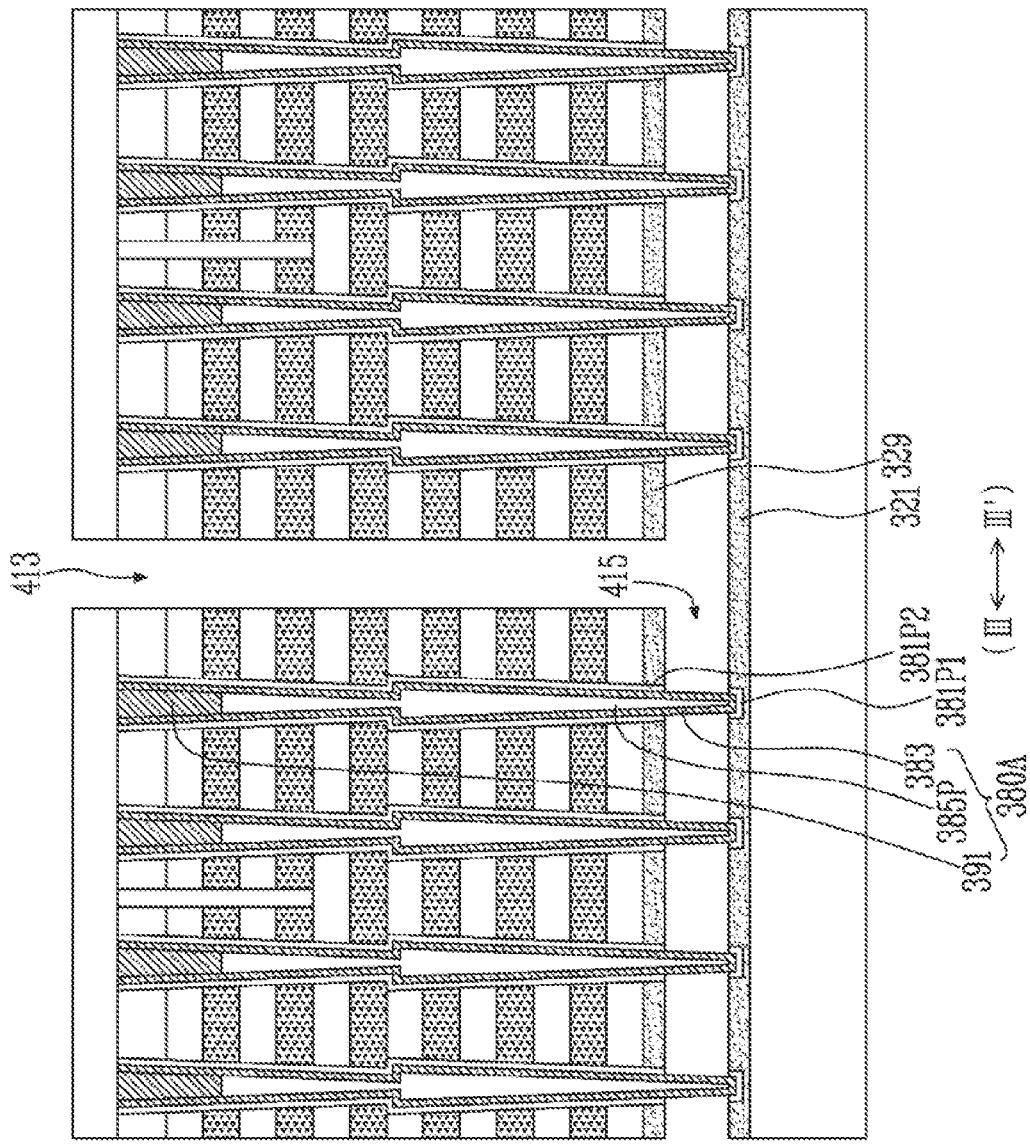
Figure 11C:
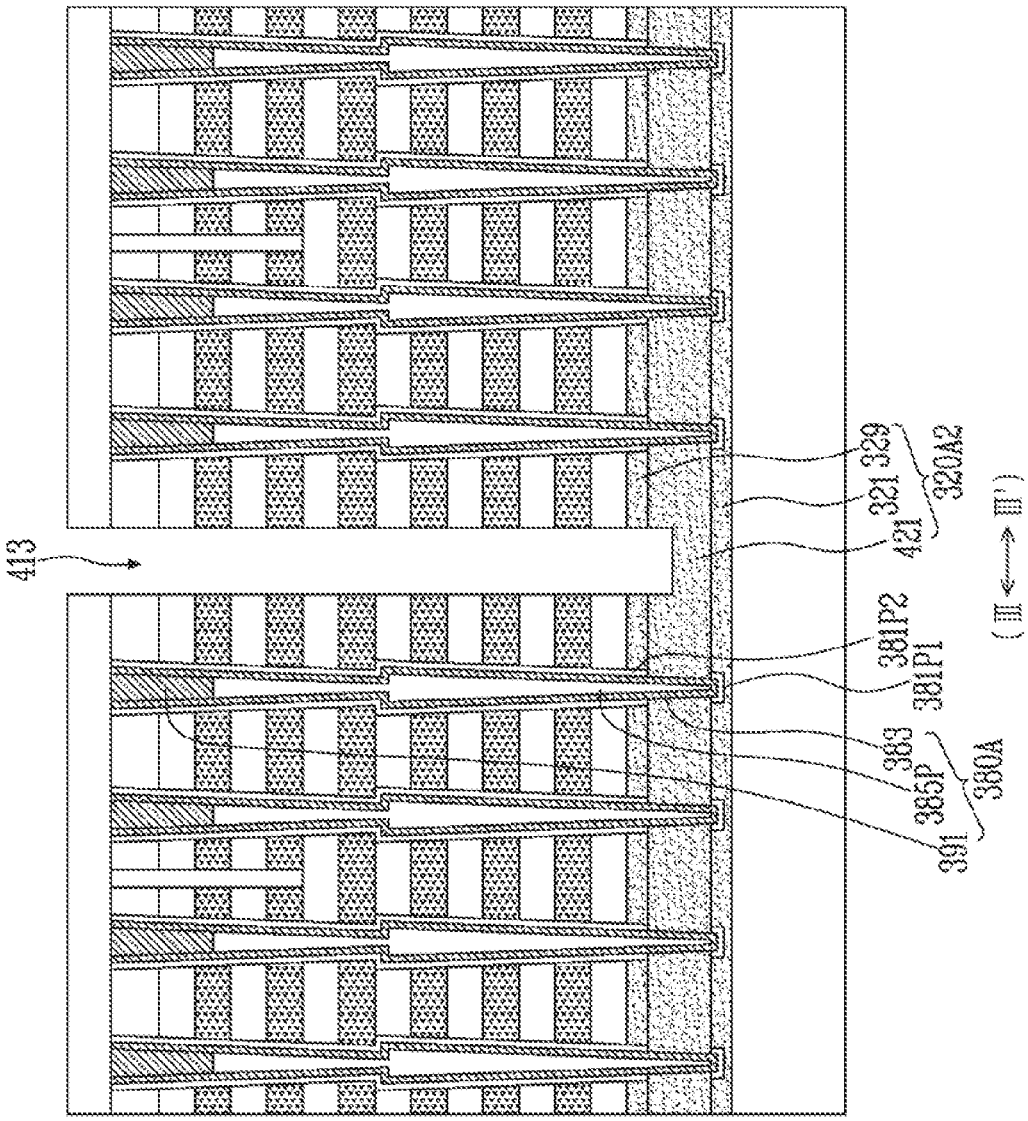

FIGS. 11A to 11C are cross-sectional diagrams illustrating an embodiment regarding step ST7 shown in FIG. 7.

Referring to FIG. 11A, forming an upper slit, forming an isolation insulting layer 401 filling the upper slit, and forming a second upper insulating layer 411 on the first upper insulating layer 399 may be performed before step ST7 is performed. The second upper insulating layer 411 may extend to cover the channel structure 380A, the supporting pillar 380B, the first contact plug 397A, and the second contact plug 397B shown in FIG. 10K. The upper slit may correspond to the upper slit USI shown in FIGS. 2 and 3C.

Step ST7 may include forming a slit 413 passing through the second upper insulating layer 411, the first upper insulating layer 399, and the stepped stack structure 379. The slit 413 may extend into the preliminary first semiconductor pattern 320A1. The slit 413 may pass through the second semiconductor layer 329 of the preliminary first semiconductor pattern 320A1. The slit 413 may extend into the sacrificial layer 325 of the preliminary first semiconductor pattern 320A1. The sacrificial layer 325 may be exposed through the bottom surface of the slit 413.

Referring to FIG. 11B, step ST7 may include removing the sacrificial layer 325 of the preliminary first semiconductor pattern 320A1 shown in FIG. 11A to expose a memory layer through the slit 413 and dividing the memory layer into a first memory pattern 381P1 and a second memory pattern 381P2 by removing the exposed memory layer. When an etching process for removing the memory layer is performed, the first protective layer 323 and the second protective layer 327 of the preliminary first semiconductor pattern 320A1 shown in FIG. 11A may be removed to expose the first semiconductor layer 321 and the second semiconductor layer 329 of the preliminary first semiconductor pattern 320A1.

Hereinafter, a space disposed between the first semiconductor layer 321 and the second semiconductor layer 329 and extending between the first memory pattern 381P1 and the second memory pattern 381P2 may be defined as a horizontal space 415. The horizontal space 415 may expose the channel layer 383 of the channel structure 380A.

Referring to FIG. 11C, step ST7 may include filling the horizontal space 415 shown in FIG. 11B with a channel coupling pattern 421. The channel coupling pattern 421 may contact the first and second semiconductor layers 321 and 329 and the channel layer 383. The channel coupling pattern 421 may include an n-type impurity or a p-type impurity.

The channel coupling pattern 421 may be formed by a selective growth method, for example, a Selective Epitaxial Growth (SEG) method using at least one of the first and second semiconductor layers 321 and 329 and the channel layer 383 as a seed layer. According to an embodiment, the channel coupling pattern 421 may be formed by a non-selective method such as a chemical vapor deposition (CVD) method.

A first semiconductor pattern 320A2 including the first semiconductor layer 321, the second semiconductor layer 329, and the channel coupling pattern 421 may be formed by the processes described above with reference to FIGS. 11A to 11C.

FIGS. 12A, 12B, 13, 14A, and 14B are cross-sectional diagrams illustrating an embodiment regarding processes performed subsequent to step ST7 shown in FIG. 7.

Figure 12A:
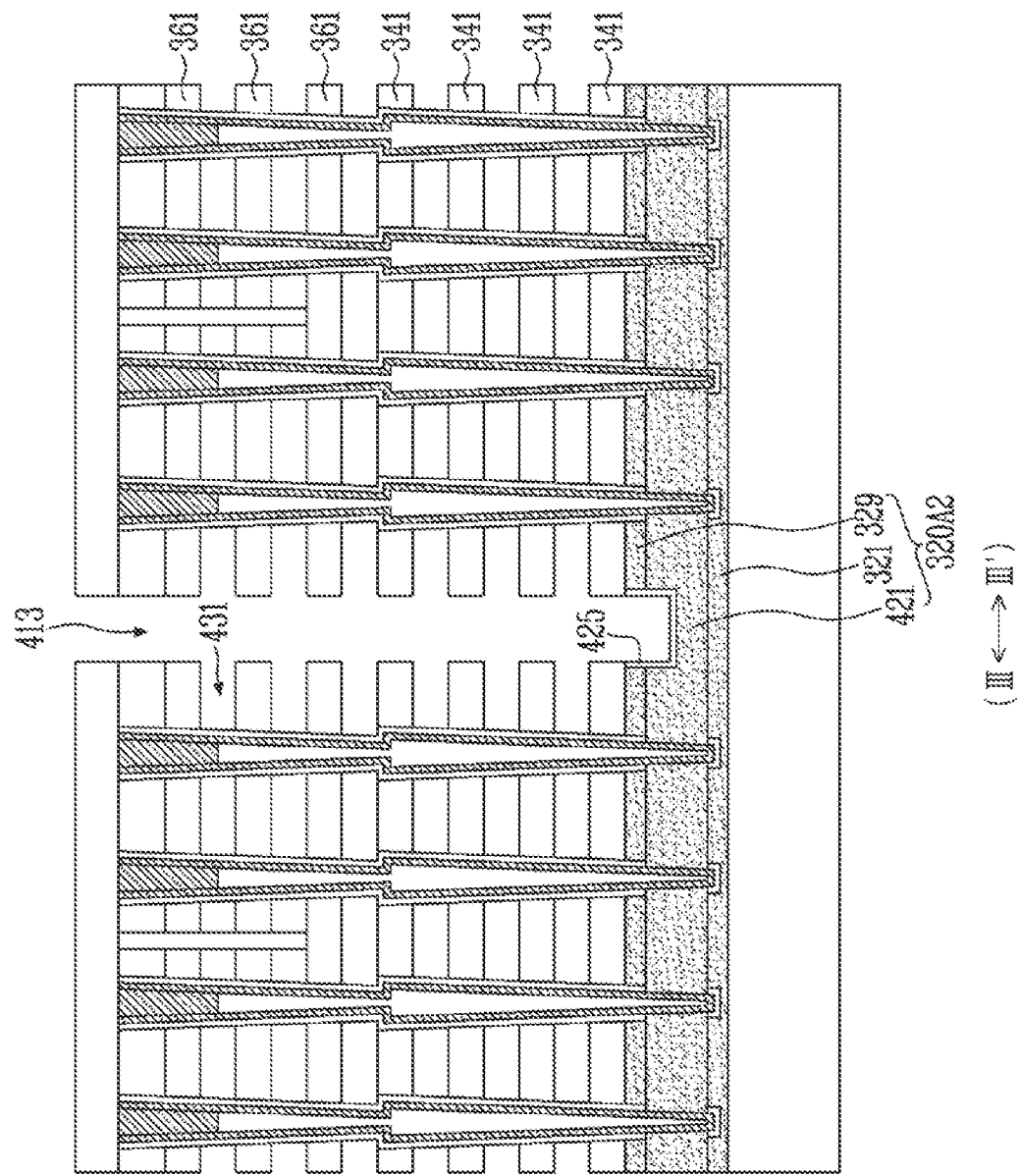

FIGS. 12A and 12B are cross-sectional diagrams illustrating replacing the first sacrificial layers 343 described with reference to FIG. 9A and the second sacrificial layers 363 described with reference to FIG. 9F by conductive patterns.

Referring to FIG. 12A, an oxide layer 425 may be formed on a surface of the first semiconductor pattern 320A2 through the slit 413. The oxide layer 425 may be formed by oxidizing a part of the first semiconductor pattern 320A2.

Subsequently, first sacrificial layers and second sacrificial layers adjacent to the slit 413 may be selectively removed. Hereinafter, regions from which the first sacrificial layers and the second sacrificial layers are removed may be referred to as gate regions 431. The gate regions 431 may be defined between the first and second interlayer insulating layers 341 and 361.

Referring to FIG. 12B, after the gate regions 431 shown in FIG. 12A are opened, the gate regions 431 may be filled with conductive patterns 433, respectively.

Forming the conductive patterns 433 may include forming a barrier metal layer extending along surfaces of the gate regions 431, forming a conductive layer thick enough to fill the gate regions 431 on the barrier metal layer, and etching the barrier metal layer and the conductive layer to be separated into the conductive patterns 433. Accordingly, a gate stack structure 430 including the first and second interlayer insulating layers 341 and 361 and the conductive patterns 433 disposed between the first and second interlayer insulating layers 341 and 361 that neighbor each other may be formed.

Figure 13:
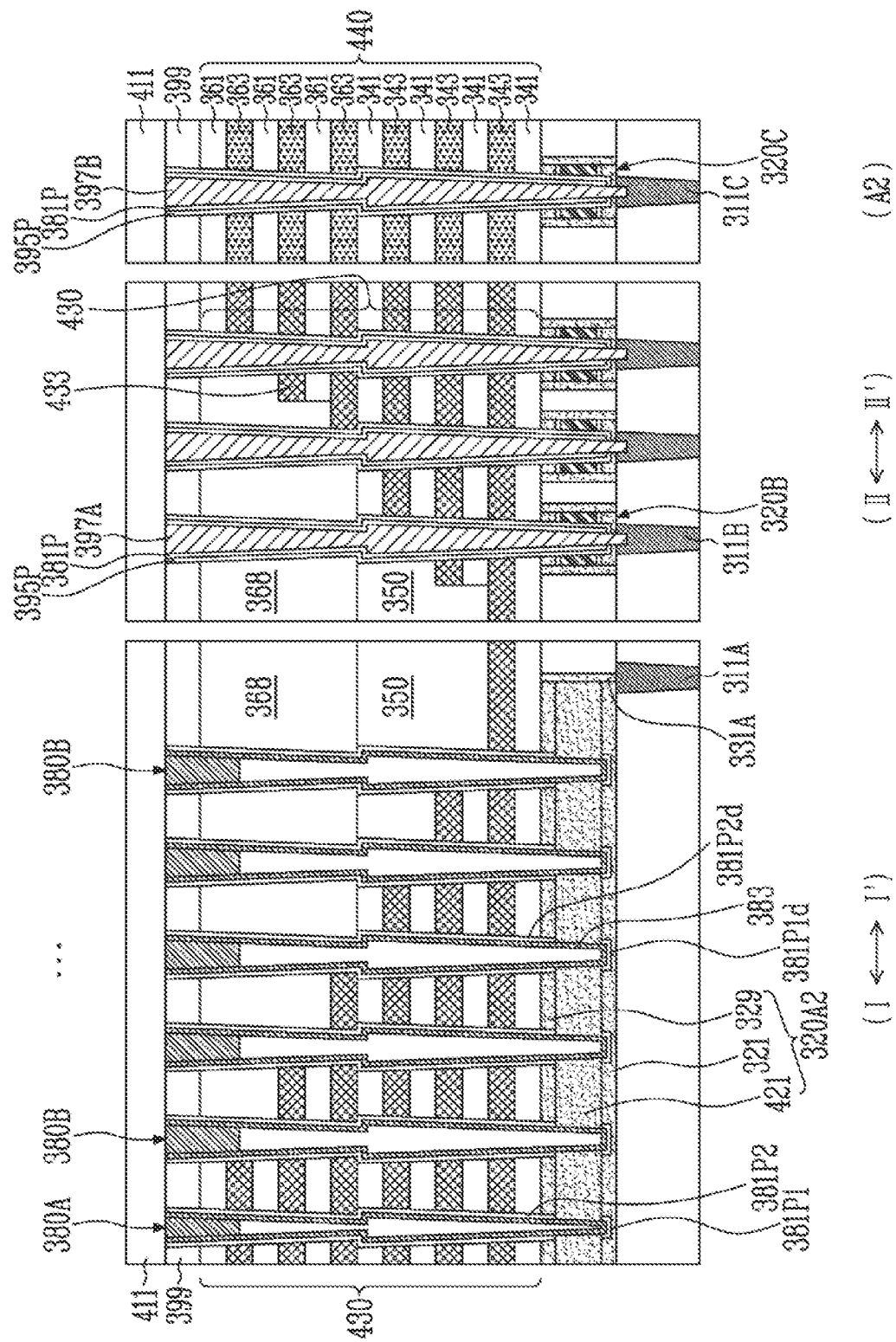

FIG. 13 is a cross-sectional diagram of an end of the first semiconductor pattern 320A2 formed by the processes described above with reference to FIGS. 11A to 11C, the stepped structure of the gate stack structure 430 formed by the processes described above with reference to FIGS. 12A and 12B, and the first and second sacrificial layers 343 and 363 remaining and forming a dummy stack structure 440.

Referring to FIG. 13, the first vertical doped pattern 331A may remain on a sidewall of the first semiconductor pattern 320A2.

The gate stack structure 430 may surround the channel structure 380A, the supporting pillar 380B, and the first contact plug 397A. The supporting pillar 380B and the first contact plug 397A may pass through the stepped structure of the gate stack structure 430 covered by the first gap-fill insulating layer 350 and the second gap-fill insulating layer 368. The conductive patterns 433 of the gate stack structure 430 may surround the channel structure 380A and parts of the conductive patterns 433 forming the stepped structure of the gate stack structure 430 may surround the supporting pillar 380B and the first contact plug 397A.

The channel coupling pattern 421 of the first semiconductor pattern 320A2 may not only extend between the first memory pattern 381P1 and the second memory pattern 381P2 but extend to contact the channel layer 383 of the supporting pillar 380B. Accordingly, the memory layer surrounding the supporting pillar 380B may be divided into a first dummy pattern 381P1d and a second dummy pattern 381P2d. The supporting pillar 380B may be insulated from the conductive patterns 433 by the second dummy pattern 381P2d.

The first contact plug 397A may be insulated from the conductive patterns 433 by the dummy memory layer 381P. Accordingly, according to an embodiment, operating characteristics of the semiconductor memory device may be secured even when a barrier structure for preventing formation of the conductive patterns 433 around the first contact plug 397A is not separately formed. Therefore, the semiconductor memory device according to an embodiment may prevent processes from being difficult and defective due to a manufacturing process for forming a barrier structure.

When the gate stack structure 430 is formed, some of the first and second sacrificial layers 343 and 363 which are disposed in the second region A2 spaced apart farther from the slit 413 shown in FIGS. 12A and 12B than the first region A1 shown in FIG. 2 might not be replaced by the conductive patterns 433 but may remain. The first and second sacrificial layers 343 and 363 remaining in the second region A2 and the first and second interlayer insulating layers 341 and 361 may form the dummy stack structure 440. The dummy stack structure 440 may overlap the third semiconductor pattern 320C and may surround the second contact plug 397B.

Figure 14A:
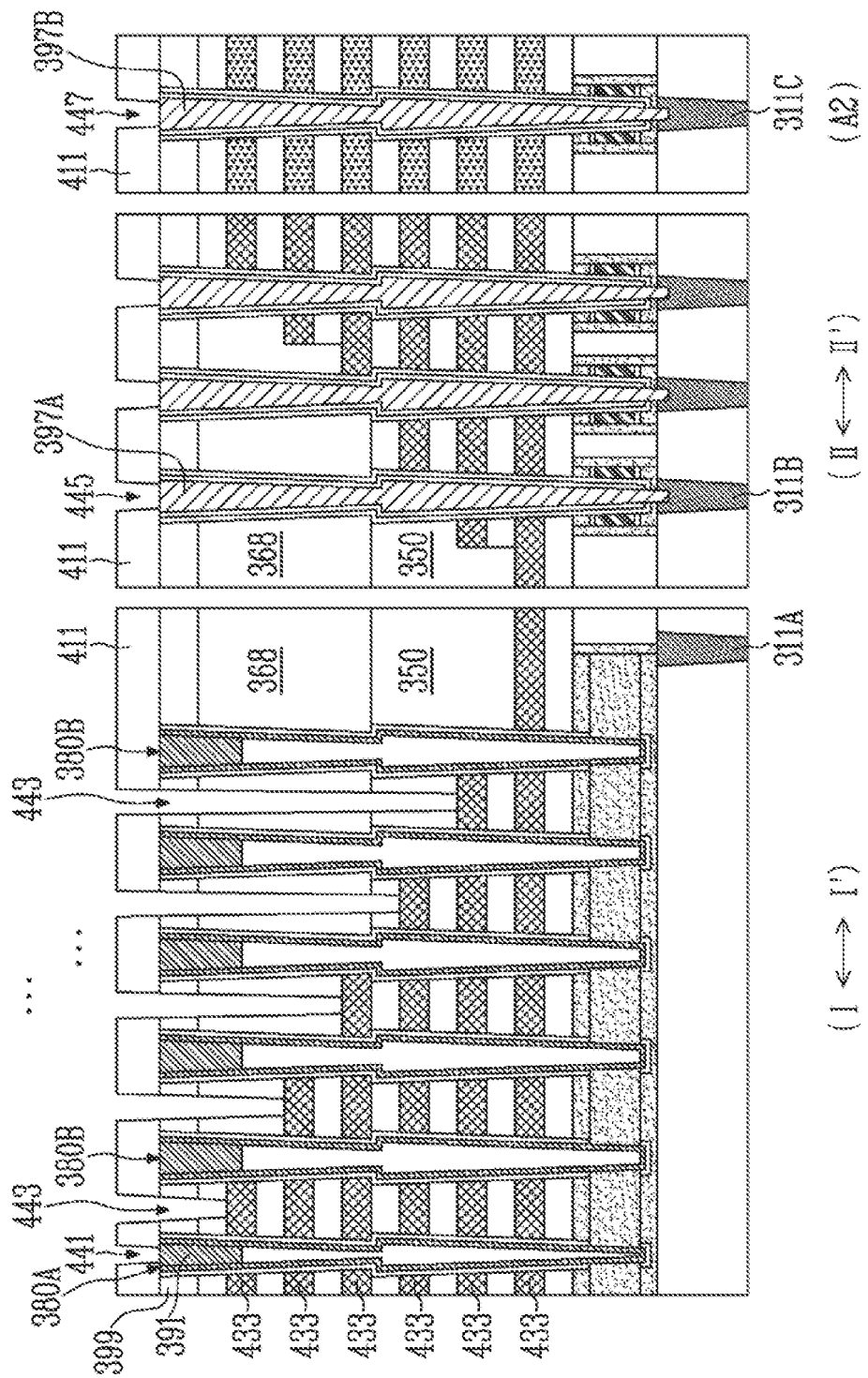
Figure 14B:
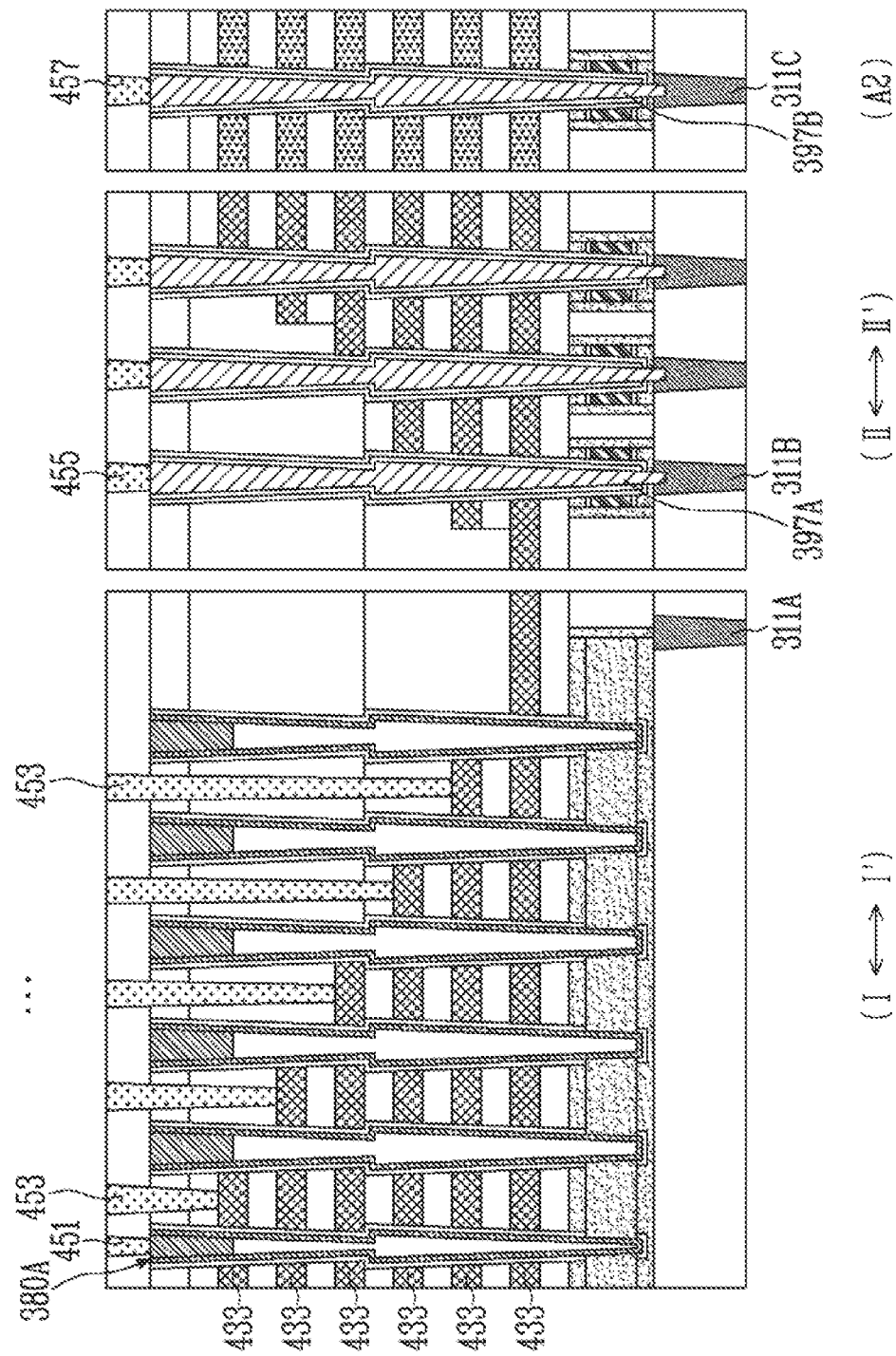

FIGS. 14A and 14B are cross-sectional diagrams illustrating forming a bit-line contact plug 451, a gate contact plug 453, a first upper contact plug 455, and a second upper contact plug 457.

Referring to FIG. 14A, upper contact holes 441, 443, 445, and 447 passing through at least one of the second upper insulating layer 411, the first upper insulating layer 399, the second gap-fill insulating layer 368, and the first gap-fill insulating layer 350 may be formed. The supporting pillar 380B may be covered by the second upper insulating layer 411 not to be externally exposed.

The upper contact holes 441, 443, 445, and 447 may include a first upper contact hole 441 exposing the capping pattern 391 of the channel structure 380A, a second upper contact hole 443 exposing corresponding one among the conductive patterns 433, a third upper contact hole 445 exposing the first contact plug 397A, and a fourth upper contact hole 447 exposing the second contact plug 397B. The second upper contact hole 443 may overlap the stepped structure and may expose the conductive pattern 433 corresponding to the second upper contact hole 443.

Referring to FIG. 14B, after each of the first, second, third, and fourth upper contact holes 441, 443, 445, and 447 is filled with a conductive material, a surface of the conductive material may be planarized. Accordingly, the bit-line contact plug 451, the gate contact plug 453, the first upper contact plug 455, and the second upper contact plug 457 may be formed.

The bit-line contact plug 451 may be coupled to the channel structure 380A, the gate contact plug 453 may be coupled to the conductive pattern 433 corresponding to the gate contact plug 453, the first upper contact plug 455 may be coupled to the first contact plug 397A, and the second upper contact plug 457 may be coupled to the second contact plug 397B.

Subsequently, processes, such as forming the bit line BL shown in FIG. 1, that are subsequent to the process of forming the bit-line contact plug 451, the gate contact plug 453, the first upper contact plug 455, and the second upper contact plug 457 may be performed. The bit line BL may be coupled to the bit-line contact plug 451.

Figure 15:
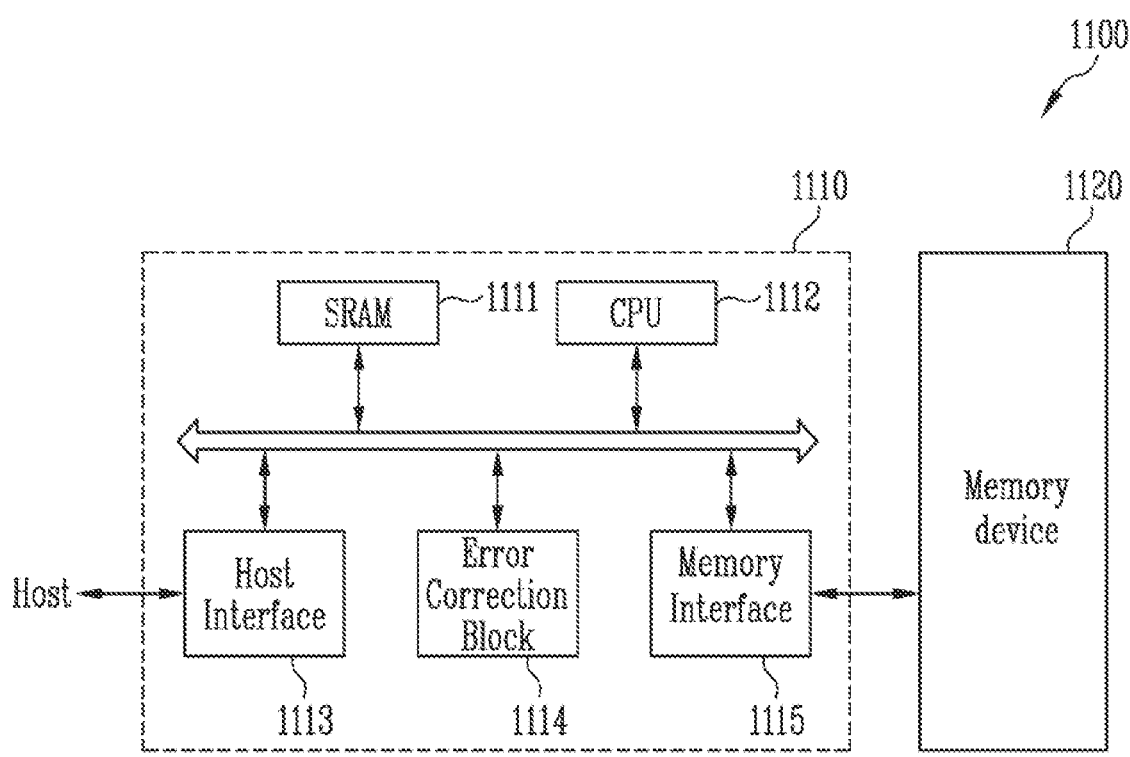
FIG. 15 is a block diagram illustrating a configuration of a memory system according to an embodiment.

FIG. 15 is a block diagram illustrating a memory system 1100 according to an embodiment.

Referring to FIG. 15, the memory system 1100 may include a memory device 1120 and a memory controller 1110.

The memory device 1120 may be a multi-chip package including a plurality of flash memory chips. The memory device 1120 may include a gate stack structure including interlayer insulating layers and conductive patterns alternately stacked on each other and having a stepped structure, a contact plug passing through the stepped structure of the gate stack structure, and an insulating structure surrounding the contact plug.

The memory controller 1110 may be configured to control the memory device 1120 and may include Static Random Access Memory (SRAM) 1111, a Central Processing Unit (CPU) 1112, a host interface 1113, an error correction block 1114, and a memory interface 1115. The SRAM 1111 may serve as operational memory of the CPU 1112, the CPU 1112 may perform general control operations for data exchange of the memory controller 1110, and the host interface 1113 may include a data exchange protocol of a host accessing the memory system 1100. In addition, the error correction block 1114 may detect and correct errors included in data read from the memory device 1120, and the memory interface 1115 may perform interfacing with the memory device 1120. In addition, the memory controller 1110 may further include Read Only Memory (ROM) for storing code data for interfacing with the host.

The memory system 1100 having the above-described configuration may be a Solid State Drive (SSD) or a memory card in which the memory device 1120 and the memory controller 1110 are combined. For example, when the memory system 1100 is an SSD, the memory controller 1110 may communicate with an external device (e.g., a host) through one of various interface protocols including, but not limited to, a Universal Serial Bus (USB), a MultiMedia Card (MMC), Peripheral Component Interconnection-Express (PCI-E), Serial Advanced Technology Attachment (SATA), Parallel Advanced Technology Attachment (PATA), a Small Computer Small Interface (SCSI), an Enhanced Small Disk Interface (ESDI), and Integrated Drive Electronics (IDE).

Figure 16:
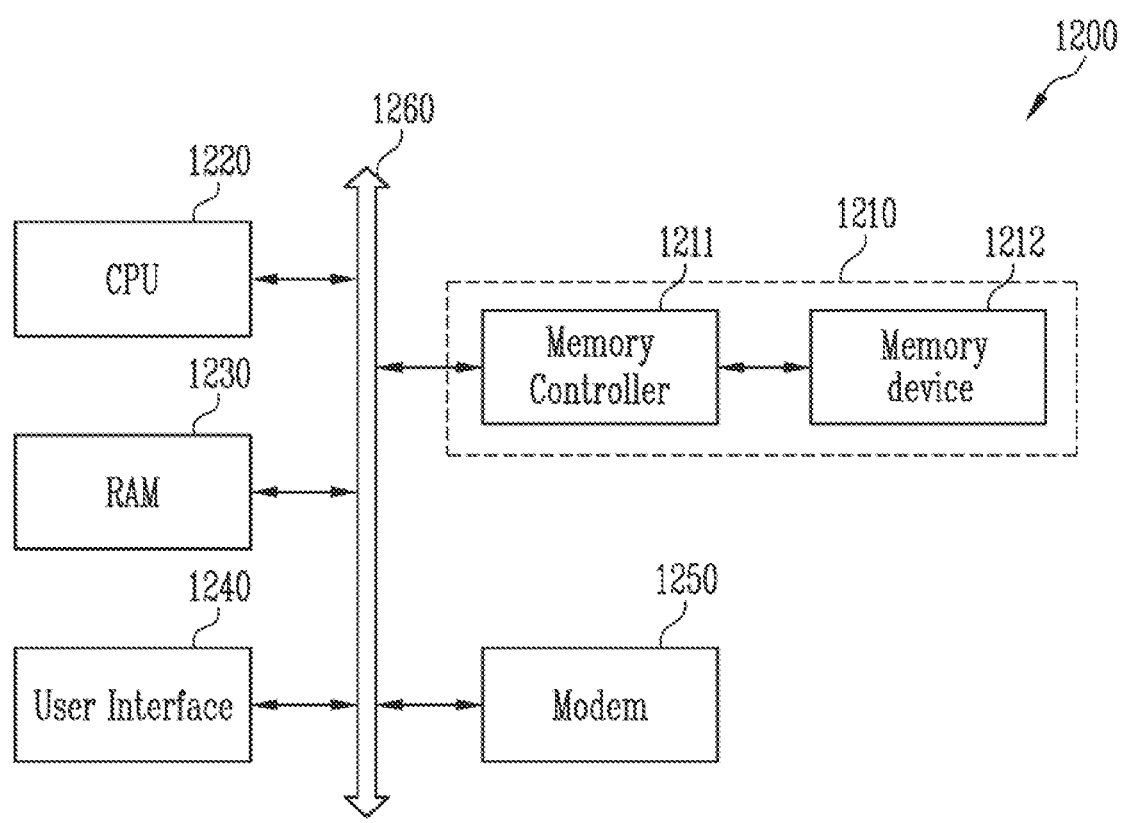
FIG. 16 is a block diagram illustrating a configuration of a computing system according to an embodiment.

FIG. 16 is a block diagram illustrating a configuration of a computing system 1200 according to an embodiment.

Referring to FIG. 16, the computing system 1200 may include a CPU 1220, Random Access Memory (RAM) 1230, a user interface 1240, a modem 1250, and a memory system 1210 that are electrically coupled to a system bus 1260. In addition, when the computing system 1200 is a mobile device, a battery for supplying an operating voltage to the computing system 1200 may be further included, an application chipset, an image processor, mobile DRAM, and the like may be further included.

The memory system 1210 may include a memory device 1212 and a memory controller 1211. The memory device 1212 may include a gate stack structure including interlayer insulating layers and conductive patterns alternately stacked on each other and having a stepped structure, a contact plug passing through the stepped structure of the gate stack structure, and an insulating structure surrounding the contact plug.

According to the present disclosure, manufacturing processes may be simplified by forming a contact hole using a channel hole forming process.

According to the present disclosure, an insulating structure that is capable of insulating a contact plug disposed in a contact hole from a conductive pattern of a gate stack structure may be formed by a memory layer forming process, and thus manufacturing processes may be simplified.

What is claimed is:

1. A semiconductor device comprising:
a lower structure including transistors and interconnection structures respectively connected to the transistors;
a gate stack structure disposed over a portion of the lower structure;
a first semiconductor pattern disposed between the lower structure and the gate stack structure, wherein the gate stack structure includes a cell array region over the first semiconductor pattern and a contact region protruding farther laterally than the first semiconductor pattern from the cell array region;
a second semiconductor pattern disposed between the lower structure and the contact region of the gate stack structure;
a lower contact plug disposed between the second semiconductor pattern and a corresponding interconnection structure, among the interconnection structures;
a contact plug passing through the contact region of the gate stack structure and the second semiconductor pattern to be in contact with the lower contact plug; and
an insulating layer interposed between the contact plug and the gate stack structure and extending between the contact plug and the second semiconductor pattern.

2. A semiconductor memory device, comprising:
a lower contact plug;
a semiconductor pattern disposed over the lower contact plug, the semiconductor pattern including a first semiconductor layer, a first protective layer, a sacrificial layer, a second protective layer, and a second semiconductor layer;
a gate stack structure disposed over the semiconductor pattern and including a cell array region and a stepped region extending from the cell array region;
a channel structure passing through the cell array region of the gate stack structure;
a memory layer surrounding a sidewall of the channel structure;
a first contact plug disposed in the stepped region of the gate stack structure; and
an insulating layer surrounding a sidewall of the first contact plug to insulate the first contact plug from the gate stack structure,
wherein the first contact plug passes through the insulating layer and the semiconductor pattern to contact the lower contact plug.

3. The semiconductor memory device of claim 2, wherein the first semiconductor layer, the first protective layer, the sacrificial layer, the second protective layer, and the second semiconductor layer of the semiconductor pattern are sequentially stacked over the lower contact plug.

4. The semiconductor memory device of claim 2, wherein the first semiconductor layer and the second semiconductor layer of the semiconductor pattern include a doped silicon layer.

5. The semiconductor memory device of claim 2, wherein the first protective layer and the second protective layer of the semiconductor pattern include a material having a different etch rate from the sacrificial layer.

6. The semiconductor memory device of claim 2, wherein the sacrificial layer of the semiconductor pattern includes a silicon layer.

7. The semiconductor memory device of claim 2, wherein the first semiconductor layer, the first protective layer, the sacrificial layer, the second protective layer, and the second semiconductor layer of the semiconductor pattern surround the first contact plug.

8. The semiconductor memory device of claim 2, wherein the lower contact plug is connected to a transistor included in a peripheral circuit via an interconnection structure.

9. The semiconductor memory device of claim 2, wherein a width of the semiconductor pattern is greater than a width of the first contact plug.

10. The semiconductor memory device of claim 2, further comprising:
a channel coupling pattern disposed under the cell array region of the gate stack structure; and
two semiconductor layers with the channel coupling pattern interposed between the two semiconductor layers,
wherein one of the two semiconductor layers is disposed at a level where the first semiconductor layer is disposed, and another of the two semiconductor layers is disposed at a level where the second semiconductor layer is disposed.

11. The semiconductor memory device of claim 10, wherein the channel structure extends into the channel coupling pattern and the two semiconductor layers.

12. The semiconductor memory device of claim 11, wherein the memory layer is divided into a first memory pattern and a second memory pattern,
wherein the first memory pattern covers a bottom of the channel structure,
wherein the second memory pattern is disposed between the channel structure and the gate stack structure, and
wherein the channel coupling pattern extends between the first memory pattern and the second memory pattern to contact the channel structure.

13. The semiconductor memory device of claim 2, wherein the insulating layer includes an oxide layer.

14. The semiconductor memory device of claim 2, wherein the gate stack structure includes a first stack structure and a second stack structure on the first stack structure,
wherein the gate stack structure further includes a hole having an undercut region at a boundary between the first stack structure and the second stack structure, and
wherein the memory layer and the channel structure are disposed in the hole.

15. The semiconductor memory device of claim 2, further comprising a dummy stack structure disposed at a level where the gate stack structure is disposed, the dummy stack structure including dummy interlayer insulating layers and sacrificial layers alternately stacked with each other.

16. The semiconductor memory device of claim 15, further comprising a second contact plug passing through the dummy stack structure.

* * * * *